(12) United States Patent
Wei et al.

(10) Patent No.: US 12,293,051 B2
(45) Date of Patent: May 6, 2025

(54) DISPLAY PANEL AND DISPLAY DEVICE

(71) Applicants: Wuhan Tianma Micro-Electronics Co., Ltd., Wuhan (CN); Wuhan Tianma Micro-Electronics Co., Ltd. Shanghai Branch, Shanghai (CN)

(72) Inventors: Qibing Wei, Wuhan (CN); Peng Zhang, Wuhan (CN)

(73) Assignees: Wuhan Tianma Micro-Electronics Co., Ltd., Wuhan (CN); Wuhan Tianma Micro-Electronics Co., Ltd. Shanghai Branch, Shanghai (CN)

( * ) Notice: Subject to any disclaimer, the term of this patent is extended or adjusted under 35 U.S.C. 154(b) by 22 days.

(21) Appl. No.: 18/404,260

(22) Filed: Jan. 4, 2024

(65) Prior Publication Data
US 2024/0353964 A1    Oct. 24, 2024

(30) Foreign Application Priority Data
Apr. 24, 2023  (CN) .......................... 202310451218.8

(51) Int. Cl.
G06F 3/044   (2006.01)
G06F 3/041   (2006.01)
H10K 59/40   (2023.01)

(52) U.S. Cl.
CPC .......... *G06F 3/0446* (2019.05); *G06F 3/0412* (2013.01); *H10K 59/40* (2023.02); *G06F 2203/04111* (2013.01)

(58) Field of Classification Search
CPC ................ G06F 3/0446; G06F 3/0412; G06F 2203/04111; G10K 59/40
See application file for complete search history.

(56) References Cited

U.S. PATENT DOCUMENTS

| | | | |
|---|---|---|---|
| 2015/0242027 A1* | 8/2015 | Kida | G06F 3/047 345/173 |
| 2020/0167042 A1* | 5/2020 | Tada | H10K 59/12 |
| 2020/0209997 A1* | 7/2020 | Kim | H10K 59/40 |
| 2020/0210003 A1* | 7/2020 | Hong | B60K 35/25 |
| 2020/0210006 A1* | 7/2020 | Son | G06F 3/0412 |
| 2020/0210009 A1* | 7/2020 | Kim | G06F 3/0443 |
| 2020/0210012 A1* | 7/2020 | Kim | H10K 59/131 |
| 2022/0308702 A1* | 9/2022 | Wang | G06F 3/0448 |

(Continued)

FOREIGN PATENT DOCUMENTS

| | | |
|---|---|---|
| CN | 113518966 A | 10/2021 |
| CN | 114201066 A | 3/2022 |
| WO | 202287820 A1 | 5/2022 |

*Primary Examiner* — Sejoon Ahn
(74) *Attorney, Agent, or Firm* — Anova Law Group, PLLC

(57) ABSTRACT

A display panel and a display device are provided. The touch layer of the display panel includes first touch units including first touch electrodes and second touch units including second touch electrodes. At least two mounting holes are provided in the touch area, and the auxiliary electrodes in the touch layer include a first auxiliary electrode located between the two mounting holes. At least one first touch unit is cut off by the mounting holes. At least one first auxiliary electrode is connected to at least one of two first touch units adjacent to the first touch unit in a second direction. Or at least one second touch unit is cut off by the mounting holes, and at least one first auxiliary electrode is connected to at least one of two second touch units adjacent to the second touch unit.

18 Claims, 17 Drawing Sheets

(56) References Cited

U.S. PATENT DOCUMENTS

| | | | |
|---|---|---|---|
| 2022/0334438 A1* | 10/2022 | Murata | G02F 1/134345 |
| 2023/0240109 A1* | 7/2023 | Lee | H10K 59/65 |
| | | | 257/40 |
| 2023/0413651 A1* | 12/2023 | Jeon | H10K 59/8792 |
| 2024/0074281 A1* | 2/2024 | Wu | H10K 59/122 |

\* cited by examiner

DISPLAY PANEL AND DISPLAY DEVICE

CROSS-REFERENCE TO RELATED APPLICATION

This application claims the priority of Chinese Patent Application No. 202310451218.8, filed on Apr. 24, 2023, the content of which is incorporated by reference in its entirety.

TECHNICAL FIELD

The present disclosure generally relates to the field of display technologies and, more particularly, relates to a display panel and a display device.

BACKGROUND

Touch display devices have become the main means of human-computer interaction for personal mobile communication devices and comprehensive information terminals, such as tablet computers, smart phones, and super laptop computers, due to their advantages of ease of operation, intuition, and flexibility.

With the development of science and technology, people have more and more diversified functional requirements for the touch display devices. Functional modules such as cameras are integrated into the touch display devices. To pursue a higher screen ratio, functional modules such as cameras are usually arranged in the display area of the screen. Correspondingly, the film layer where the touch electrodes of the touch display device are located is provided with mounting holes to get out the way of the functional modules such as cameras. How to improve the touch sensitivity of the touch display device around the mounting holes has become one of the to-be-solved technical problems urgently at this stage. The present disclosed display panels and display devices are direct to solve one or more problems set forth above and other problems in the arts.

SUMMARY

One aspect of the present disclosure provides a display panel. The display panel includes a substrate; and a touch layer disposed on one side of the substrate and including a touch area of the display panel. The touch layer includes a plurality of first touch units and a plurality of second touch units; the plurality of first touch units extend in a first direction and are arranged in a second direction; the plurality of second touch units extend in the second direction and are arranged in the first direction; the plurality of first touch units include a plurality of first touch electrodes arranged in the first direction and connected in series with each other; the plurality of the second touch units include a plurality of second touch electrodes arranged in the second direction and connected in series with each other; the plurality of first touch electrodes are insulated from the plurality of second touch electrodes; the display panel includes two mounting holes located in the touch area; the touch layer is hollowed out at positions of the two mounting holes; the two mounting holes are arranged in the first direction; there is a first interval between two adjacent mounting holes; the touch layer further includes an auxiliary electrode; the auxiliary electrode includes a first auxiliary electrode located in the first interval; at least one of the plurality of first touch units is cut off by at least one of the at least two mounting holes; the first touch unit cut off by the at least one of the at least two mounting holes is Ri; first touch units adjacent to Ri in the second direction are Ri+1 and Ri−1, respectively; one first auxiliary electrode is connected to at least one of Ri+1 and Ri−1; or at least one of the plurality of second touch units is cut off by at least one of the two mounting holes, the at least one second touch unit cut off by the at least one of the at least two mounting holes is Ti; second touch units adjacent to Ti in the first direction are Ti+1 and Ti−1, respectively; one first auxiliary electrode is connected to at least one of Ti+1 and Ti−1; and i≥2, and i is an integer.

Another aspect of the present disclosure provides a display device. The display device includes a display panel. The display panel includes a substrate; and a touch layer disposed on one side of the substrate and including a touch area of the display panel. The touch layer includes a plurality of first touch units and a plurality of second touch units; the plurality of first touch units extend in a first direction and are arranged in a second direction; the plurality of second touch units extend in the second direction and are arranged in the first direction; the plurality of first touch units include a plurality of first touch electrodes arranged in the first direction and connected in series with each other; the plurality of the second touch units include a plurality of second touch electrodes arranged in the second direction and connected in series with each other; the plurality of first touch electrodes are insulated from the plurality of second touch electrodes; the display panel includes two mounting holes located in the touch area; the touch layer is hollowed out at positions of the two mounting holes; the at mounting holes are arranged in the first direction; there is a first interval between two adjacent mounting holes; the touch layer further includes an auxiliary electrode; the auxiliary electrode includes a first auxiliary electrode located in the first interval; at least one of the plurality of first touch units is cut off by at least one of the two mounting holes; the first touch unit cut off by the at least one of the two mounting holes is Ri; first touch units adjacent to Ri in the second direction are Ri+1 and Ri−1, respectively; one first auxiliary electrode is connected to at least one of Ri+1 and Ri−1; or at least one of the plurality of second touch units is cut off by at least one of the two mounting holes, the at least one second touch unit cut off by the at least one of the two mounting holes is Ti; second touch units adjacent to Ti in the first direction are Ti+1 and Ti−1, respectively; one first auxiliary electrode is connected to at least one of Ti+1 and Ti−1; and i≥2, and i is an integer.

Other aspects of the present disclosure can be understood by those skilled in the art in light of the description, the claims, and the drawings of the present disclosure.

BRIEF DESCRIPTION OF THE DRAWINGS

To illustrate the technical solutions in the embodiments of the present disclosure more clearly, the following briefly introduces the accompanying drawings used in the description of the embodiments. Obviously, the accompanying drawings in the following description are only some embodiments of the present disclosure, for those of ordinary skill in the art, other drawings may also be obtained from these drawings without creative effort.

DETAILED DESCRIPTION

Various exemplary embodiments of the present disclosure will now be described in detail with reference to the accompanying drawings. It should be noted that the relative arrangements of components and steps, numerical expressions and numerical values set forth in these embodiments do not limit the scope of the present disclosure unless specifically stated otherwise.

The following description of at least one exemplary embodiment is merely illustrative in nature and in no way taken as limiting the disclosure, its application or uses.

Techniques, methods and devices known to those of ordinary skill in the relevant art may not be discussed in detail, but where appropriate, such techniques, methods and devices should be considered part of the description.

In all examples shown and discussed herein, any specific values should be construed as exemplary only, and not as limitations. Therefore, other instances of the exemplary embodiment may have different values.

It will be apparent to those skilled in the art that various modifications and variations may be made in the present disclosure without departing from the spirit or scope of the disclosure. Therefore, the present disclosure is intended to cover the modifications and variations of the present disclosure falling within the scope of the corresponding claims (technical solutions to be protected) and their equivalents. It should be noted that the implementation manners provided in the embodiment of the present disclosure may be combined with each other if there is no contradiction.

It should be noted that, like numerals and letters denote like items in the following figures, therefore, once an item is defined in one figure, it does not require further discussion in subsequent figures.

Figure 1:
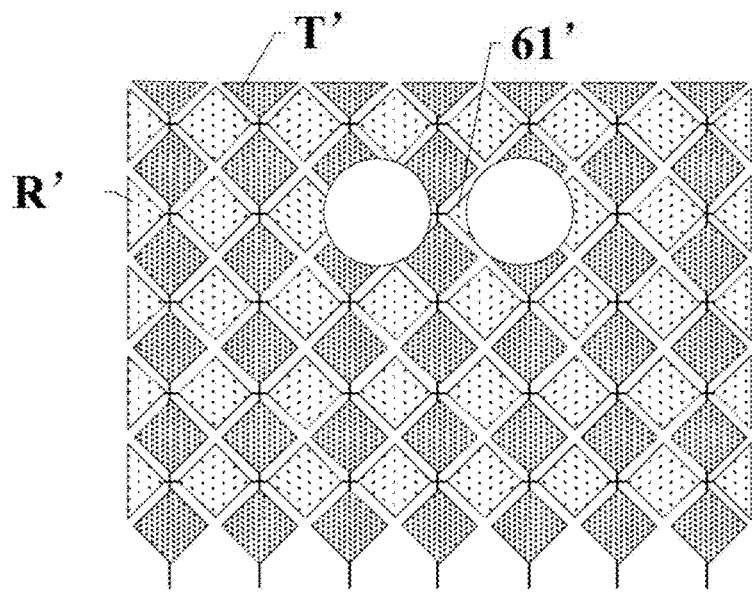
FIG. 1 is a schematic relative relationship between the touch layer and the mounting hole of a display panel.

FIG. 1 is a diagram showing a relative positional relationship between the touch layer and the mounting hole in the display panel. As shown in FIG. 1, the touch layer includes a first touch unit R' and a second touch unit T'. When the mounting hole is introduced, a portion of the first touch unit R' in the touch layer is cut off by the mounting hole. After being cut off by the mounting hole, the first touch electrode 61' remaining between the two mounting holes is lost more, and the area is relatively small. The facing area between the second touch unit T' and the first touch unit cut off by the mounting hole is reduced, which seriously affects the touch performance of the area between the two mounting holes.

Figure 2:
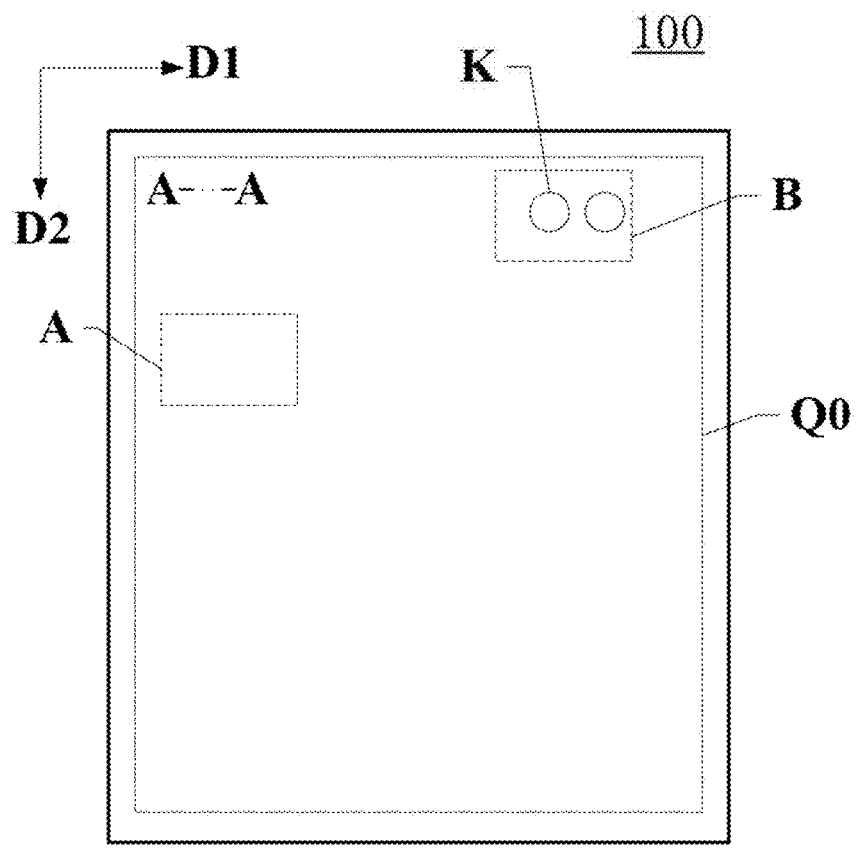
FIG. 2 is a schematic diagram of an exemplar display panel according to various disclosed embodiments of the present disclosure.

The present disclosure provides a display panel and a display device. FIG. 2 is a schematic structural diagram of an exemplary display panel according to one embodiment of the present disclosure. This embodiment only shows that the display panel may include two mounting holes, but the specific shape and actual number of mounting holes may not be limited. It should be noted that the present disclosure only takes the display panel with a rectangular structure as an example, and the actual shape of the display panel may not be limited. In some other embodiments of the present disclosure, the display panel may also be embodied in other shapes, such as a rectangle rounded corners, circle or other non-rectangular special-shaped structures, etc.

Figure 3:
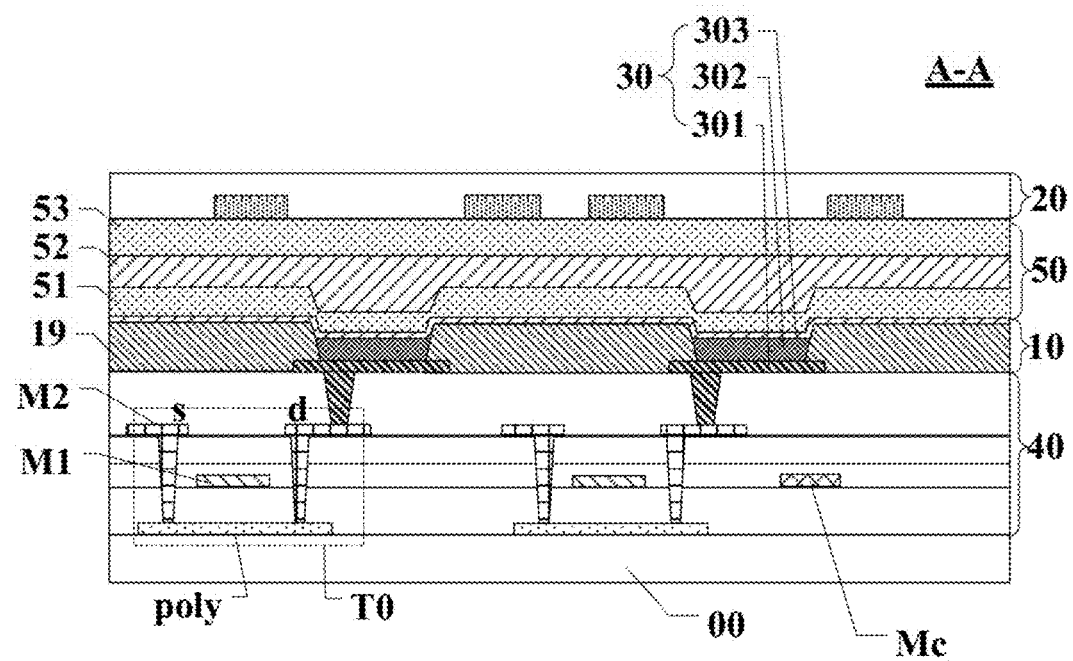
FIG. 3 is an AA-sectional view of the display panel in FIG. 2.

FIG. 3 is an AA-sectional view of the display panel in FIG. 2. The display panel provided in this embodiment may be a display panel using organic light-emitting diode display technology, that is, an organic light-emitting diode (OLED) display panel. As shown in FIGS. 2-3, the display panel 000 may include a substrate 00, a touch area Q0 and at least two mounting holes K in the touch area Q0. The display panel 000 may further include a driving layer 40 and a display layer 10 located between the substrate 00 and a touch layer 20. The display layer 10 may be located on the side of the driving layer 40 away from the substrate 00. The display layer 10 may include a light-emitting element 30. The light-emitting element 30 may include an anode 301, a light-emitting material layer 302 and a cathode 303. The anode 301 may be electrically connected to the driving layer 40. When the driving layer 40 supplies an appropriate voltage to the anode 301, the holes in the anode 301 and the electrons in the cathode 303 may combine in the light-emitting material layer 302 to generate bright light. Compared with thin-film field-effect transistor liquid crystal displays, the OLED display devices may have the characteristics of high visibility and high brightness, and may be more power-saving, lighter in weight, and thinner in thickness. In some other embodiments of the present disclosure, the display panel may also be a display panel using an inorganic light-emitting diode display technology, such as a Micro LED display panel, or a Mini LED display panel, etc.

FIG. 3 only uses an OLED display panel for illustration. In one embodiment, an encapsulation layer 50 may be further disposed on the side of the cathode 303 away from the anode 301, and a driving circuit may be disposed in the driving layer 40 for providing a driving voltage to the light-emitting element 30 to drive the light-emitting element 30 to emit light. In one embodiment, the driving layer 40 may include a first metal layer M1, a capacitor metal layer Mc, and a second metal layer M2 disposed on the substrate 00. The first metal layer M1 may be, for example, a gate metal layer, and the gate of the transistor T0 in the display panel may be disposed on the first metal layer M1. The capacitor metal layer Mc may be used to form a capacitor structure with the first metal layer M1 or the second metal layer M2. The source electrode s and the drain electrode d of the transistor T0 in the display panel may be located on the second metal layer M2. The semiconductor layer poly may include a source region and a drain region, and the source region and the drain region may be formed by doping with N-type impurity ions or P Type impurity ions. The source electrode s of the transistor T0 may be electrically connected to the source region of the semiconductor layer poly through the contact hole, and the drain electrode d of the transistor T0 may be electrically connected to the drain region of the semiconductor layer poly through the contact hole. In one embodiment, the encapsulation layer 50 may be a thin-film encapsulation layer, including a first inorganic layer 51, an organic layer 52 and a second inorganic layer 53 for isolating water and oxygen and preventing external moisture and oxygen from affecting the light-emitting material layer 302.

Figure 4:
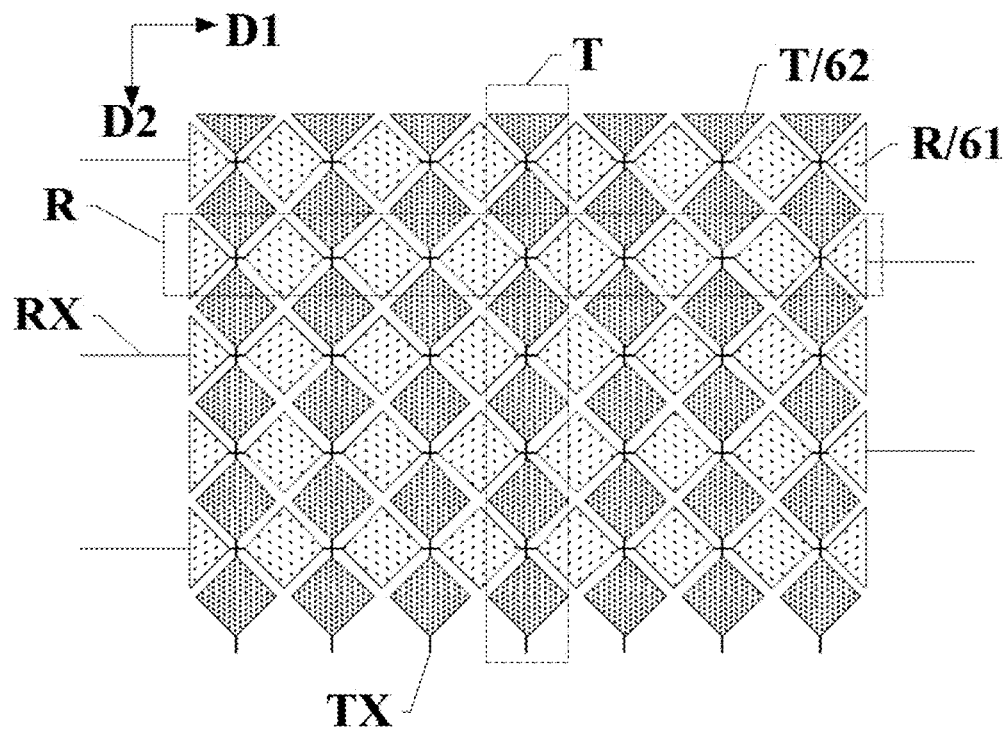
FIG. 4 is a schematic zoomed-in view of the area A in FIG. 2.

FIG. 4 is a schematic zoomed-in view of the area A in FIG. 2, and illustrates a relative position relationship diagram between the first touch unit R and the second touch unit T in the area where no mounting holes are provided. The present disclosure is described by taking the first touch unit R and the second touch unit T as mutual capacitive touch units as an example. It should be noted that FIG. 4 only shows the touch layer in the area A, and does not show other film layers of the display panel. Further, FIG. 4 discriminates between the first touch unit R and the second touch unit T by different filling patterned, but does not limit the film layers where the first touch electrode 61 in the first touch unit R and the second touch electrode 62 in the second touch unit are located. The first touch electrode 61 and the second touch electrode 62 may be located in a same film layer or in different film layers. When the first touch electrode 61 and the second touch electrode 62 are arranged on the same layer, the first touch electrodes 61 in the first touch unit R may be electrically connected through a connection provided on the same layer, and the second touch electrodes 62 in the second touch unit T may be electrically connected through a bridge member. In some embodiment, the first touch electrodes 61 in the first touch unit R may be electrically connected through a bridge member, and the second touch electrodes 62 in the second touch unit T may be electrically connected through a connection portion provided on the same layer. In other embodiments, both the first touch electrodes 61 and the second touch electrodes 62 may include a plurality of metal grid structures. The metal grid structures may be mesh structures formed by crossing a plurality of metal wires.

FIGS. 5-8 respectively illustrate an enlarged schematic view of the area B in FIG. 2. FIGS. 5-8 only illustrate the position relationship between the mounting holes and the touch electrodes in the region B, and other layer structures in this area are not shown.

Referring to FIGS. 2-8, the display panel 100 provided by one embodiment of the present disclosure may include the touch area Q0. The display panel 100 may also include the substrate 00 and the touch layer 20 disposed on one side of the substrate 00. The touch layer 20 may include at least the touch area Q0. The touch layer 20 may include a plurality of first touch units R and a plurality of second touch units T. The first touch units R may extend in the first direction D1 and may be arranged in the second direction D2. The second touch units T may extend in the second direction D2 and may be arranged in the first direction D1. The first touch unit R may include a plurality of first touch electrodes 61 arranged in the first direction D1 and connected in series. The second touch unit T may include a plurality of second touch electrodes 62 arranged in the second direction D2 and connected in series. The first touch electrodes 61 and the second touch electrodes 62 may be insulated from each other. At least two mounting holes K may be included in the area Q0, the touch layer 20 may be hollowed out at the position of the mounting holes K, and the at least two mounting holes K may be arranged in the first direction D1. There may be a first interval between two adjacent mounting holes K. The touch layer 20 may further include an auxiliary electrode 1, and the auxiliary electrode 1 may include a first auxiliary electrode 01 located in the first interval.

Figure 5:
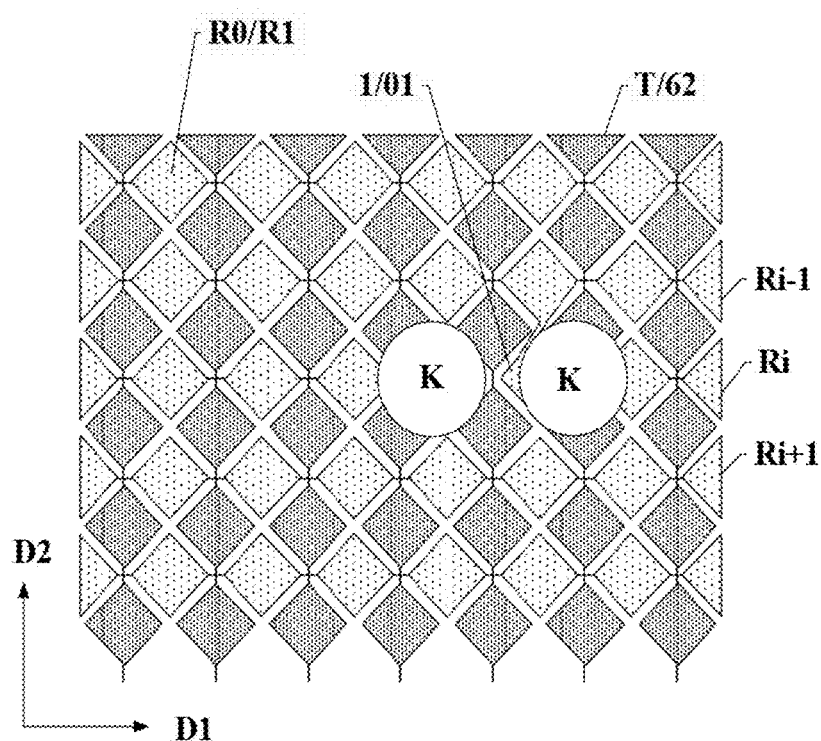
FIG. 5 is a schematic zoomed-in view of the area B in FIG. 2.
Figure 6:
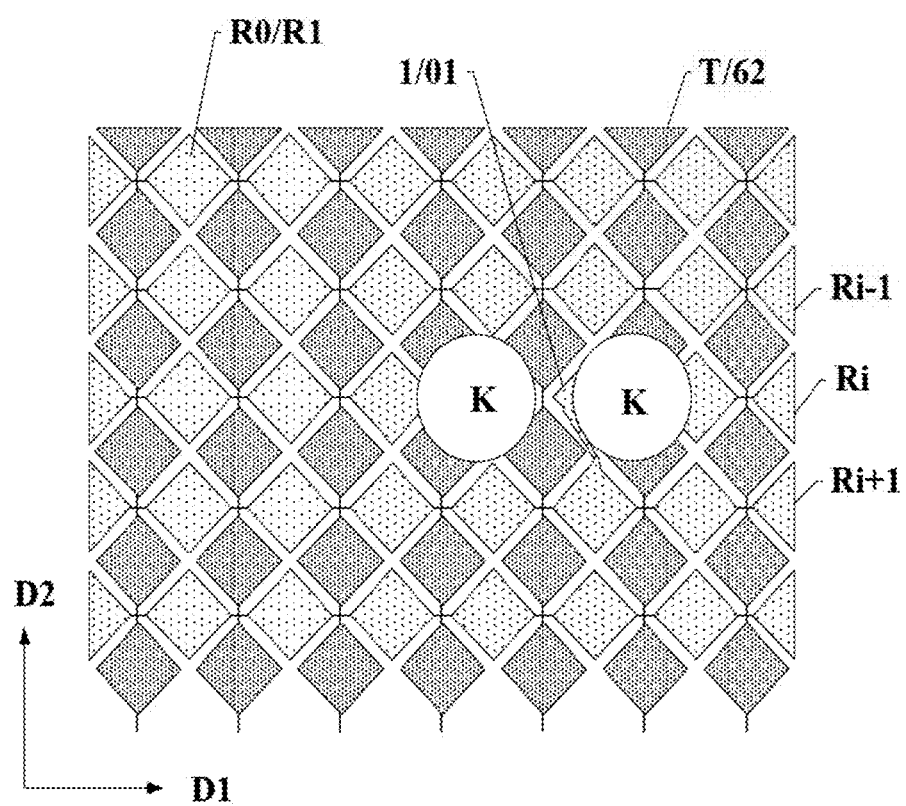
FIG. 6 is another schematic zoomed-in view of the area B in FIG. 2.

Referring to FIG. 5 and FIG. 6, at least one first touch unit R may be cut off by the mounting hole K, the first touch unit R cut off by the mounting hole may be Ri, and the first touch units adjacent to Ri in the second direction D2 may be Ri+1 and Ri−1. At least one first auxiliary electrode 01 may be connected to at least one of Ri+1 and Ri−1.

Figure 7:
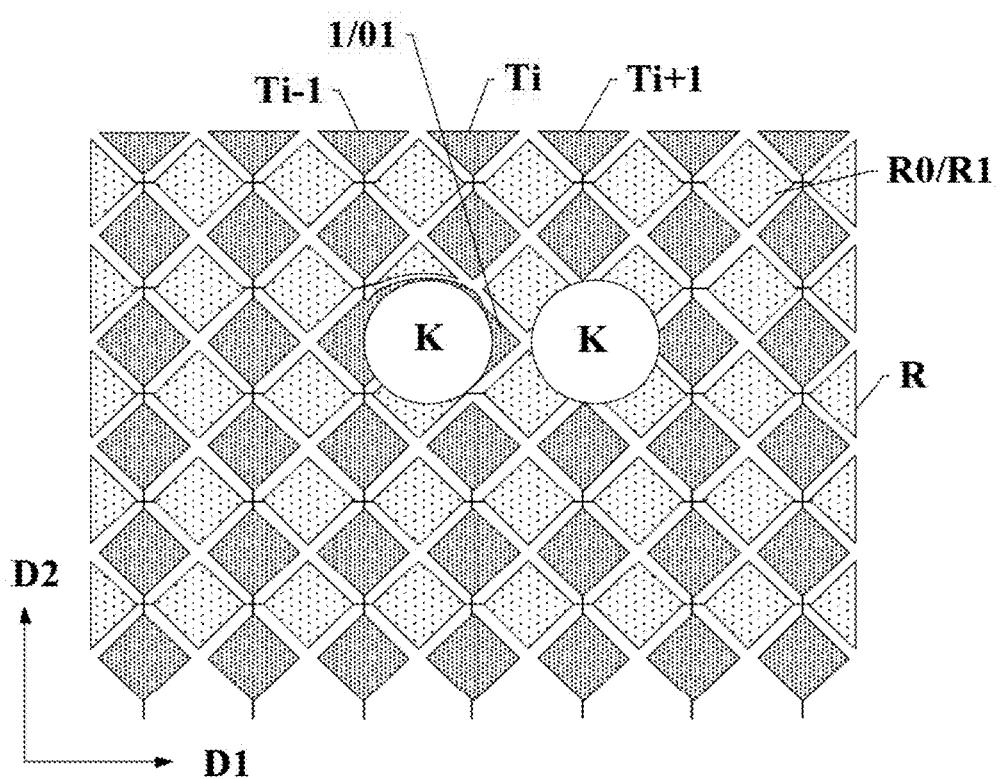
FIG. 7 is another schematic zoomed-in view of the area B in FIG. 2.
Figure 8:
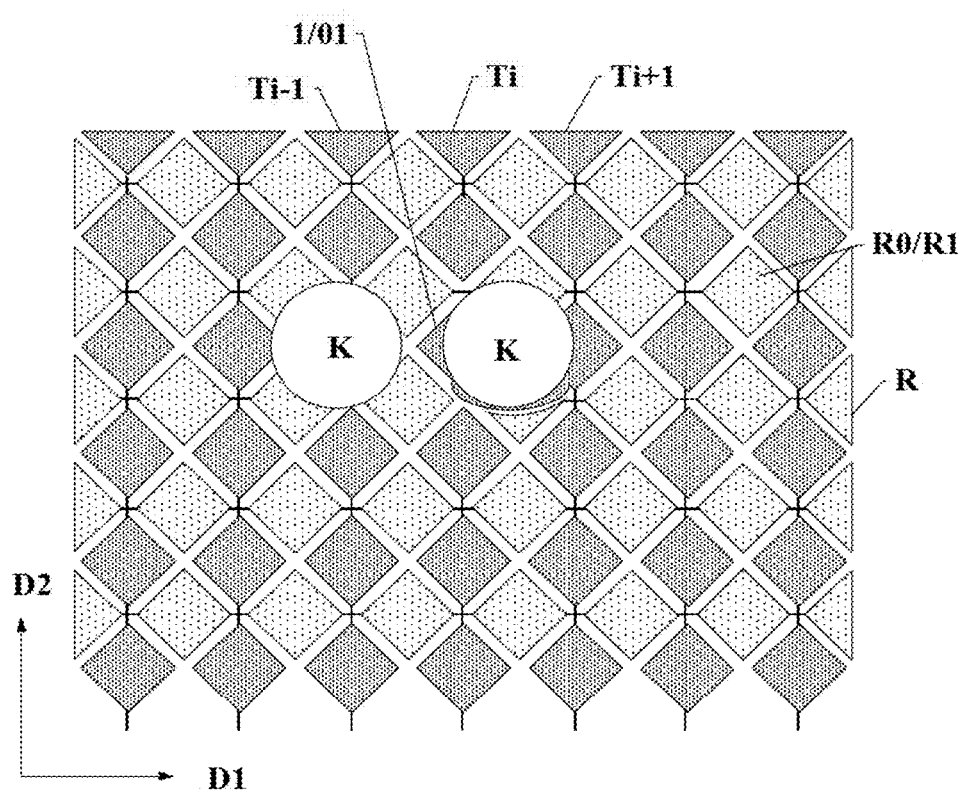
FIG. 8 is another schematic zoomed-in view of the area B in FIG. 2.

In some embodiments, referring to FIG. 7 and FIG. 8, at least one second touch unit T may be cut off by the mounting hole K. The second touch unit cut off by the mounting K hole may be Ti, and the second touch units adjacent to Ti in the first direction D1 may be Ti+1 and Ti−1. At least one first auxiliary electrode 01 may be connected to at least one of Ti+1 and Ti−1.

It should be noted that, referring to FIG. 5 and FIG. 6, when the first touch unit Ri is cut off by the mounting hole, it may mean that, when the first touch unit Ri is compared with the first touch unit T in other areas in the display panel where no mounting holes are provided, at least one complete first touch electrode is missing. Similarly, referring to FIG. 7 and FIG. 8, when a second touch unit Ti is cut off by the mounting hole, it may mean that, when the second touch unit Ti is compared with the second touch unit in other areas in the display panel where no mounting holes are provided, at least one complete second touch electrode may be missing.

Referring to FIG. 5, when the first touch unit R is cut off by the mounting hole and the touch unit T cut off by the mounting hole is Ri, the first touch unit adjacent to Ri and above Ri may be Ri−1, and the first touch unit adjacent to Ri and located below Ri may be Ri+1. The touch layer may also include an auxiliary electrode 1. The auxiliary electrode 1 may include a first auxiliary electrode 01 located in a first interval between two adjacent mounting holes K. This embodiment shows the configuration that the first auxiliary electrode 01 is connected to Ri−1. At this time, it may be equivalent to merging the first auxiliary electrode 01 in the first interval into Ri−1, which may increase the area of Ri−1. When a touch body touches the area around the mounting hole of the display panel, the touch contact area between the main body and Ri−1 may be increased, which may be conducive to improving the touch performance.

Further, when the area of Ri−1 increases, the facing area between the second touch unit and Ri−1 may also be increased, and the sensing capacitance formed between the second touch unit and Ri−1 may also be increased during touch sensing. Because the first auxiliary electrode 01 may be located in the first interval, it may be beneficial to improve the touch sensitivity in the first interval and improve the user experience.

The embodiment shown in FIG. 5 is only illustrated by taking the connection between the first auxiliary electrode 01 and Ri−1 as an example. In some other embodiments of the present disclosure, the first auxiliary electrode 01 may also be connected to Ri+1, as shown in FIG. 6. The specific working principle of such a configuration may be similar to the working principle of the configuration in which the connection is formed between the first auxiliary electrode 01 and Ri−1, the details will not be repeated here. In some other embodiments of the present disclosure, when the first touch unit is cut off by the mounting hole, the first auxiliary electrode 01 may be electrically connected to Ri−1 and Ri+1 at the same time. The details are described in the following embodiments.

As shown in FIG. 7, when the second touch unit T is cut off by the mounting hole K, and the touch unit cut off by the mounting hole is Ti. The second touch unit adjacent to Ti and on the left side of Ti may be Ti−1, and the second touch unit adjacent to Ti and on the right side of Ti may be Ti+1. This embodiment shows the connection manner between the first auxiliary electrode 01 located in the first interval. At this time, it may be equivalent to merging the first auxiliary electrode 01 in the first interval into Ti−1. The area of Ti−1 may be increased. When a touch body touches the surrounding area of the mounting hole of the display panel, the contact area between the touch body and Ti−1 may be increased, which may be beneficial to improve the touch performance. In addition, when the area of Ti−1 is increased, the facing area between the first touch unit and Ti−1 may also be increased, and the sensing capacitance formed between the first touch unit and T−1 may also be increased during touch sensing. Because the first auxiliary electrode 01 may be in the first interval, it may be beneficial to improve the touch sensitivity in the first interval and improve the user experience. The embodiment shown in FIG. 7 is only illustrated by taking the connection between the first auxiliary electrode 01 and Ti−1 as an example.

In some other embodiments of the present disclosure, the first auxiliary electrode 01 may also be connected to Ti+1, as shown in FIG. 8. The specific working principle of such a configuration may be similar to the working principle of the configuration in which the connection is formed between the first auxiliary electrode 01 and Ti−1, which will not be repeated here. It should be noted that, in the embodiments shown in FIG. 7 and FIG. 8, the auxiliary electrode 01 may be electrically connected to Ti−1 or Ti+1, and the auxiliary electrode may be insulated from Ti, for example, the auxiliary electrode may be insulated from the second touch electrodes directly above and directly below it.

When the auxiliary electrode 01 is electrically connected to Ti−1 or Ti+1, the embodiments shown in FIG. 7 and FIG. 8 show configuration that the connection line between the auxiliary electrode 01 and the second touch electrode in Ti−1 or Ti+1 is located in the touch area. At this time, a coupling capacitance may be formed between the connection line and the first touch electrode above or below it, which may be beneficial to improve the touch sensitivity around the mounting hole.

Figure 9:
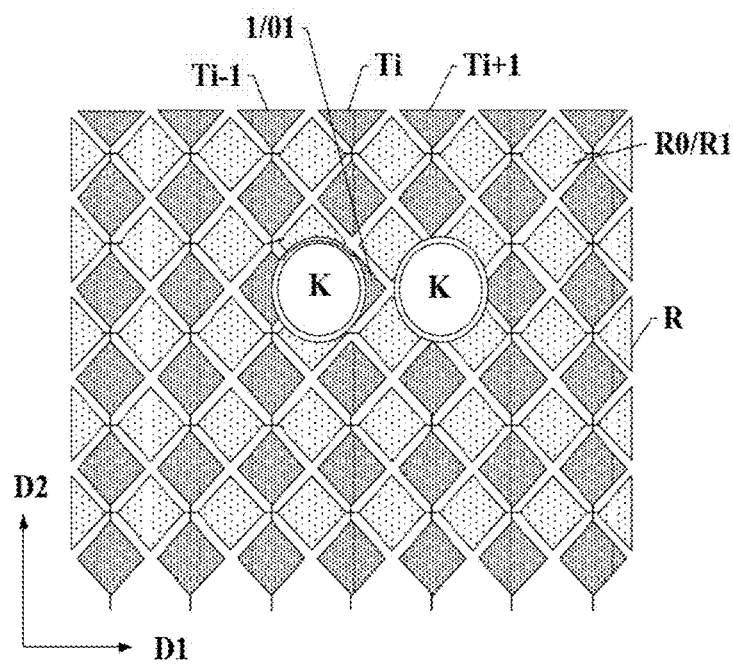
FIG. 9 is another schematic zoomed-in view of the area B in FIG. 2.

In some other embodiments of the present disclosure, the connection line between the auxiliary electrode 01 and the second touch electrode in Ti−1 or Ti+1 may also be arranged in the non-display area around the mounting hole, as shown in FIG. 9 which is an enlarged schematic diagram of the area B in FIG. 2. At this time, the connection line may not need to occupy the space of the touch area. Accordingly, the area of the first touch electrode adjacent to the connection line directly above or directly below the mounting hole may be appropriately enlarged, and the connection line between the first touch electrode and the non-display area around the mounting hole may also generate the coupling capacitance to improve the touch sensitivity around the mounting hole.

In one embodiment of the present disclosure, the area of the orthographic projection of the first auxiliary electrode 01 on the substrate may be S0. The first touch electrode 61 may include a conventional first touch electrode R0, and the area of the orthographic projection of the conventional first touch electrode R0 on the substrate may be S1, and S0<S1. The conventional first touch electrode R0 may not be adjacent to the mounting hole and the edge of the touch area. In one embodiment, the edge of the touch area may also be regarded as the border between the display area and the non-display area surrounding the display area. The conventional first touch electrode R0 may not be adjacent to the edge of the touch area, which may be considered as that the conventional first touch electrode may not be adjacent to the non-display area surrounding the display area.

It should be noted that the conventional first touch electrode R0 mentioned in the present disclosure may be regarded as the first touch electrode 61 that is not adjacent to the mounting hole and is not arranged at the edge of the touch area. Taking the embodiments shown in FIGS. 5-8 as an example, the conventional first touch electrode R0 may be the first touch electrode 61 with a diamond-like outline, and most of the first touch electrodes 61 in the display panel may be conventional first touch electrodes R0. When the first touch electrode 61 is located at the edge of the touch area or may be adjacent to the mounting hole and cut off by the mounting hole, this portion of the first touch electrode 61 may have an irregular shape, and the area of this portion of the first touch electrode 61 may be smaller than the area of the conventional first touch electrode 61. The portion of the touch electrode R0 may not be called a conventional first touch electrode R0. Similarly, the second touch electrode 62 may also include a conventional second touch electrode 62, and the contour shape of the conventional second touch electrode 62 may also be a diamond-like shape. In one embodiment, the area of the conventional second touch electrode 62 may be same as the area of the conventional first touch electrode R0.

In one embodiment of the present disclosure, the first auxiliary electrode 01 may be located in the first interval between two adjacent mounting holes, and may have an irregular shape. Compared with the conventional first touch electrode R0, the first auxiliary electrode 01 may be considered as a touch electrode with a smaller area cut off by the mounting hole, the area S0 of the orthographic projection of the first auxiliary electrode 01 on the substrate may be smaller than the area S1 of the orthographic projection of the conventional first touch electrode R0 on the substrate.

In one embodiment of the present disclosure, the area S0 of the orthographic projection of the first auxiliary electrode 01 on the substrate may be S0≤75%×S1. When the touch electrodes arranged around the mounting holes are cut off by the mounting holes, the area of the corresponding touch electrodes projected on the substrate may be smaller than the area of the conventional first touch electrode R0. When the area of this portion of the touch electrodes is greater than or equal to 75%×S1, its area may be almost same as the area of the conventional first touch electrode R0, and it may still play a good touch performance. When the area of this portion of the touch electrode is less than or equal to 75%×S1, the area of this portion of the touch electrode may decrease, the area relative to other touch electrodes may also decrease, thereby degrading the touch performance. In this embodiment, the area of the orthographic projection of the first auxiliary electrode 01 on the substrate may be limited to be less than or equal to 75%×S1, the first auxiliary electrode 01 may be integrated into other touch units, the total area of the touch electrodes after being integrated with the auxiliary electrode 01 may be increased, and the direct facing area between the touch unit and other touch units may also be increased. Accordingly, the first auxiliary electrode 01 with a smaller area may be effectively used, thereby effectively improving the touch sensitivity of the area between two adjacent mounting holes.

Figure 10:
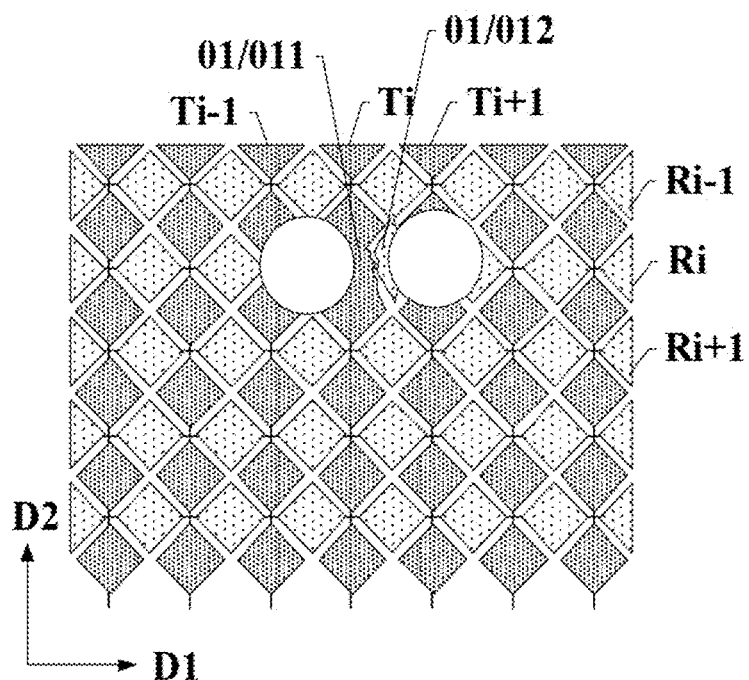
FIG. 10 is another schematic zoomed-in view of the area B in FIG. 2.

FIG. 10 is another enlarged schematic diagram of area B in FIG. 2. This embodiment shows a scheme in which two first auxiliary electrodes 01 are arranged between two adjacent mounting holes.

As shown in FIG. 10, in one embodiment of the present disclosure, at least two first auxiliary electrodes 01 may be included in a same first interval, and one of the first auxiliary electrodes 011 may be electrically connected to at least one of Ri+1 and Ri−1, and the other first auxiliary electrode 012 may be electrically connected to Ti.

Specifically, this embodiment is described by taking the first electrode unit Ri cut off by the mounting hole as an example. When two first auxiliary electrodes 01 are included in the first interval, one first auxiliary electrode 011 may be electrically connected to the second touch unit Ti such that the first auxiliary electrode 01 may be at the same potential as Ti. The other first auxiliary electrode 012 may be electrically connected to at least one of Ri+1 and Ri−1. This embodiment shows the scheme of connecting the first auxiliary electrode 012 to Ri−1. At this time, the first auxiliary electrode 012 may be equipotential to Ri−1. In some other embodiments of the present disclosure, the first auxiliary electrode 012 may also be electrically connected to Ri+1, or electrically connected to Ri+1 and Ri−1 at the same time. In one embodiment, one first auxiliary electrode 012 may be at the same potential as the first touch unit Ri−1, and the other first auxiliary electrode 011 may be at the same potential as the second touch unit Ti. Accordingly, the facing area between Ri−1 connected to the first auxiliary electrode 01 and Ti connected to another first auxiliary electrode 01 may be increased, which may be conducive to improving the coupling capacitance between the two during the touch process, and it may be beneficial to improve the touch sensitivity in the area between the mounting holes.

Further, referring to FIG. 10, in one of the present disclosure, in the same first interval, the two first auxiliary electrodes 01 may be the first sub-auxiliary electrode 011 and the second sub-auxiliary electrode 012 respectively, and the first sub-auxiliary electrode 011 and the second sub-auxiliary electrode 012 may be arranged adjacently. The first sub-auxiliary electrode 011 may include a first surface adjacent to the second sub-auxiliary electrode 012, and the second sub-auxiliary electrode 012 may include a second surface adjacent to the first sub-auxiliary electrode 011. The first surface and the second surface may both include zigzag structures, and the zigzag structures on the first surface may engage with the sawtooth structures on the second surface.

Specifically, when two first auxiliary electrodes 01 are arranged in the first interval, both the first auxiliary electrode 01 and the second auxiliary electrode 02 may be presented as irregular structures. Due to the limited space in the first interval, when the first sub-auxiliary electrode 011 and the second sub-auxiliary electrode 012 are arranged adjacent to each other in the interval, and the adjacent surfaces of the two may be arranged in zigzag structures that engage with each other, it may be beneficial to increase the facing area of the first sub-auxiliary electrode 011 and the second sub-auxiliary electrode 011. When the facing area of the two sub-auxiliary electrodes is increased, the coupling capacitance value between the two sub-auxiliary electrodes may also be increased during touch, and the detected touch signal may also be strengthened, and it may be beneficial to further improve the touch sensitivity of the area corresponding to the first interval.

Figure 11:
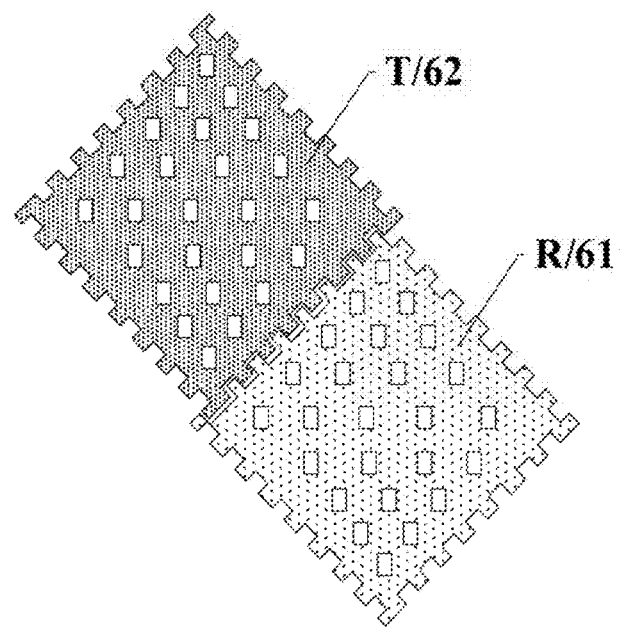
FIG. 11 is a schematic zoomed-in view of a first touch electrode and an adjacent second electrode.

It should be noted that, in the foregoing embodiments, only the first touch electrodes 61 in the first touch unit and the second touch electrodes 62 in the second touch unit are shown, and it does not represent the actual structures of the first touch electrodes 61 and the second touch electrode 62. FIG. 11 is an enlarged schematic view of the adjacent first touch electrodes 61 and second touch electrodes 62. Both the first touch electrodes 61 and the second touch electrodes 62 may have a grid structure. The openings in the grid structure may be used to expose the pixel openings in the display panel. In one embodiment, the outer edges of the first touch electrodes 61 and the second touch electrodes 62 may be both zigzag structures, and the zigzag structures of the adjacent first touch electrodes 61 and the second touch electrodes 62 may engage each other. Such a configuration may be beneficial to increase the facing area between the first touch electrode 61 and the second touch electrode 62 arranged adjacently, and it may be beneficial to increase the coupling capacitance between the two touch electrodes during a touch control. Accordingly, it may be beneficial to increase the generated touch signal, and it may be more conducive to improving the accuracy and sensitivity of the touch. It should be noted that, in the embodiment of the present disclosure, the zigzag structures as shown in FIG. 11 may all be adopted between the adjacent first touch electrodes 61 and second touch electrodes 62 to improve the overall stability of the display panel. For the touch sensitivity, the zigzag structures as shown in FIG. 11 may also be adopted between the adjacent first touch electrodes 61 and second touch electrodes 62 in the first interval.

Figure 12:
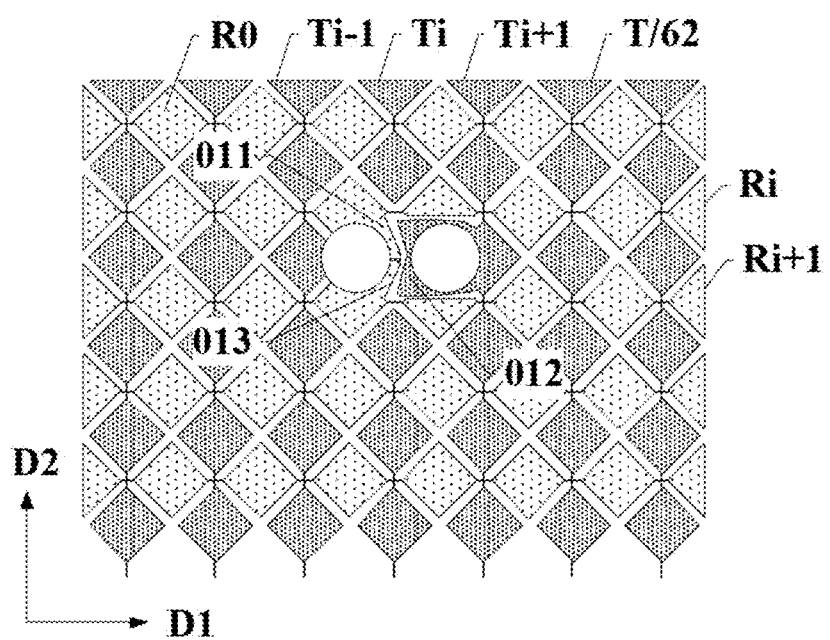
FIG. 12 is another schematic zoomed-in view of the area B in FIG. 2.

FIG. 12 is another enlarged schematic diagram of area B in FIG. 2. This embodiment shows a scheme in which three first auxiliary electrodes 01 are arranged between two adjacent mounting holes.

As shown in FIG. 12, in one embodiment of the present disclosure, three first auxiliary electrodes may be included in the same first interval, and the three first auxiliary electrodes may be respectively a first sub-auxiliary electrode 011, a second sub-auxiliary electrode 012 and a third sub-auxiliary electrode 013. In the first direction D1, the first sub-auxiliary electrode 011 and the third sub-auxiliary electrode 013 may be respectively located on the same side of the second sub-auxiliary electrode 012.

The second sub-auxiliary electrode 012 may be electrically connected to the second touch electrode 62. The first sub-auxiliary electrode 011 may be electrically connected to one of Ri and Ri+1. The third sub-auxiliary electrode 013 may be electrically connected to the other one of Ri and Ri+1. In some embodiments, the first sub-auxiliary electrode 011 may be electrically connected to one of Ri−1 and Ri+1, and the third sub-auxiliary electrode 013 may be electrically connected to the other one of Ri−1 and Ri+1.

Specifically, this embodiment shows an arrangement that three first auxiliary electrodes are arranged in one first interval. Assuming that the three first auxiliary electrodes are the first sub-auxiliary electrode 011, the second sub-auxiliary electrode 012, and the third sub-auxiliary electrode 013, in the first interval, the first sub-auxiliary electrode 011 and the second sub-auxiliary electrode 012 may be respectively connected to different first touch units. For example, the first sub-auxiliary electrode 011 may be electrically connected to Ri, the second sub-auxiliary electrode 012 may be electrically connected to Ri+1, and the third sub-auxiliary electrode 013 may be electrically connected to the second touch unit Ti+1. In the arrangement direction of two adjacent mounting holes, the first sub-auxiliary electrode 011 may be arranged adjacent to the second sub-auxiliary electrode 012, and the third sub-auxiliary electrode 013 may be arranged adjacent to the second sub-auxiliary electrode 012. In the second direction D2, the first sub-auxiliary electrode 011 may be located between the third sub-auxiliary electrode and Ri, for example, the first sub-auxiliary electrode 011 may be closer to Ri than the third sub-auxiliary electrode 013, and the third sub-auxiliary electrode 013 may be closer to Ri+1 than the first sub-auxiliary electrode 011. When the first sub-auxiliary electrode 011 is connected to Ri, and the third sub-auxiliary electrode 013 is connected to Ri+1, it may be beneficial to reduce the connection difficulty between the first sub-auxiliary electrode 011 and Ri, and reduce the connection difficulty between the third sub-auxiliary electrode 013 and Ri+1. Further, it may also be beneficial to increase the area of the first touch electrode 61 included in Ri and Ri+1. Because the second sub-auxiliary electrode 012 may be connected to the second touch control unit, when the first sub-auxiliary electrode 011 and the third sub-auxiliary electrode 013 are arranged adjacent to the second sub-auxiliary electrode 012, coupling capacitances may be generated both between first auxiliary electrode 011 and the auxiliary electrode 012 and between the third sub-auxiliary electrodes 013 and the second sub-auxiliary electrodes 012, which may also be conducive to improving the touch sensitivity of the first interval between the mounting holes.

Figure 13:
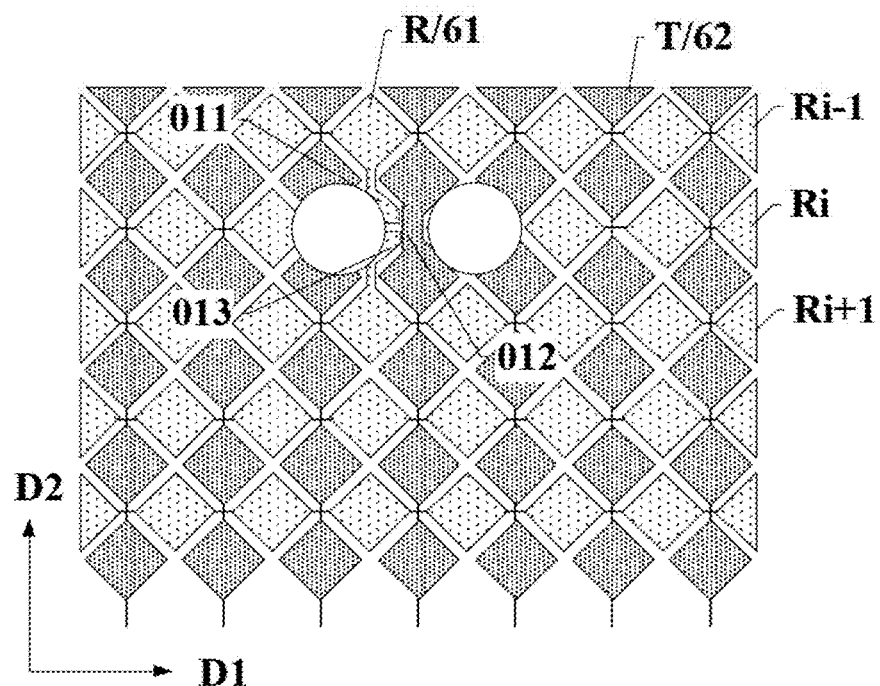
FIG. 13 is another schematic zoomed-in view of the area B in FIG. 2.

It should be noted that the embodiment in FIG. 12 is only described by taking the second touch unit Ti cut off by the mounting hole as an example. In some other embodiments of the present disclosure, when the first touch unit Ri is cut off by the mounting hole, the three first auxiliary electrodes may also be disposed in the first interval, as shown in FIG. 13, which is another enlarged schematic view of the area B in FIG. 2. FIG. 13 illustrates another approach in which three first auxiliary electrodes are disposed between two adjacent mounting holes. In this embodiment, the three first auxiliary electrodes disposed in the first interval may be the first sub-auxiliary electrode 011, the second sub-auxiliary electrode 012, and the third sub-auxiliary electrode 013. At this time, the second sub-auxiliary electrode 012 may be electrically connected to the second touch electrode 62, the first sub-auxiliary electrode 011 may be electrically connected to one of Ri−1 and Ri+1, and the third sub-auxiliary electrode 013 may be electrically connected to the other one of Ri−1 and Ri+1. In this embodiment, when both the first sub-auxiliary electrode 011 and the third sub-auxiliary electrode 013 are arranged adjacent to the second sub-auxiliary electrode 012, the coupling capacitance may be generated both between the first sub-auxiliary electrode 011 and the second sub-auxiliary electrode 012, and between the third sub-auxiliary electrode 013 and the second sub-auxiliary electrode 012, which may be also beneficial to improving the touch sensitivity of the first interval between the mounting holes.

Figure 14:
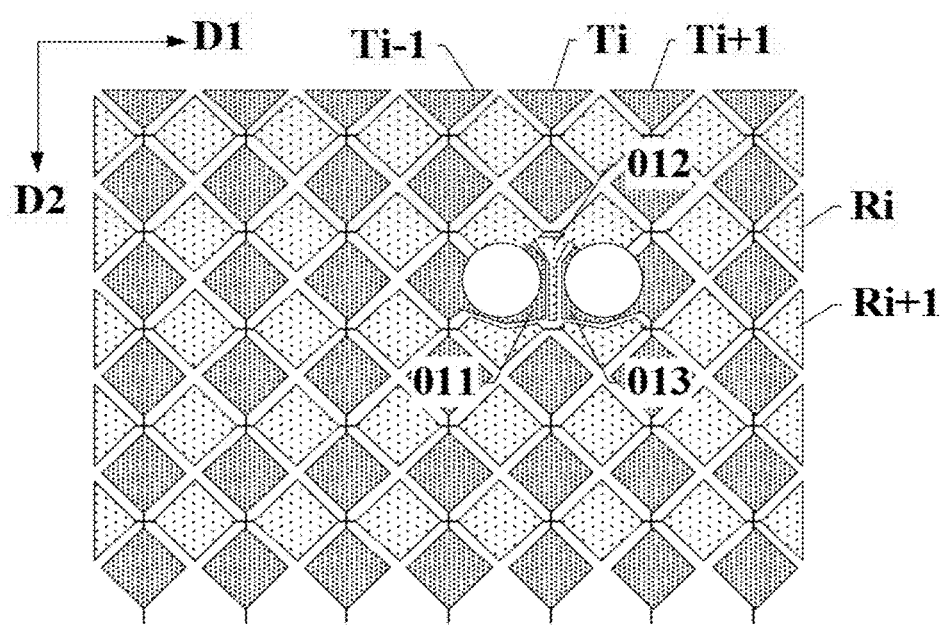
FIG. 14 is another schematic zoomed-in view of the area B in FIG. 2.

FIG. 14 is another enlarged schematic view of the area B in FIG. 2. This embodiment illustrates another solution in which three first auxiliary electrodes 01 may be arranged between two adjacent mounting holes.

As shown in FIG. 14, in one embodiment of the present disclosure, three first auxiliary electrodes may be disposed in the same first interval. The three first auxiliary electrodes may be respectively the first sub-auxiliary electrode 011, the second sub-auxiliary electrode 012 and the third sub-auxiliary electrode 013. In the first direction D1, the first sub-auxiliary electrode 011 and the third sub-auxiliary electrode 013 may be located on two sides of the second sub-auxiliary electrode 012, respectively. The second sub-auxiliary electrode 012 may be electrically connected to at least one of Ri and Ri+1. The first sub-auxiliary electrode 011 may be electrically connected to Ti−1. The third sub-auxiliary electrode 013 may be electrically connected to Ti+1. In another embodiment, the second sub-auxiliary electrode 012 is electrically connected to the second touch electrode, one of the first sub-auxiliary electrode 011 and the third sub-auxiliary electrode 013 may be electrically connected to Ri−1, and the other may be electrically connected to Ri+1. At least a portion of the first sub-auxiliary electrode 011 may be located on the first side of the second sub-auxiliary electrode 012, at least a portion of the third sub-auxiliary electrode 013 may be located on the second side of the second sub-auxiliary electrode 012, and the first side and the second side may be opposite sides in the first direction D1.

Specifically, referring to FIG. 14, when three first auxiliary electrodes are disposed in the first interval, assuming that a single first auxiliary electrode may be the first sub-auxiliary electrode 011, the second sub-auxiliary electrode 012 and the third sub-auxiliary electrode 013, respectively. The arrangement of the three first auxiliary electrodes shown in this embodiment may be that, in the first interval and in the first direction D1, the first sub-auxiliary electrode 011, the second sub-auxiliary electrode 012 and the third sub-auxiliary electrode 013 are arranged in sequence, for example, the first sub-auxiliary electrode 011 and the third sub-auxiliary electrode 013 may be located at two sides of the second sub-auxiliary electrode 012 in the first direction D1, and the second sub-auxiliary electrode 012 in the middle may be electrically connected to the first touch unit. This embodiment shows the scheme that the second sub-auxiliary electrode 012 may be connected to Ri. In some other embodiments of the present disclosure, the second sub-auxiliary electrode 012 may also be connected to Ri+1, or may be electrically connected to Ri and Ri+1 at the same time. The first sub-auxiliary electrode 011 may be electrically connected to Ti−1, and the second sub-auxiliary electrode 012 may be connected to Ti+1. In such a configuration, the second sub-auxiliary electrode 012 may not only form a coupling capacitor with the adjacent first sub-auxiliary electrode 011 on its left side, but also form a coupling capacitor with the adjacent third sub-auxiliary electrode 013 on the right side, which may be beneficial to increase the areas of the touch electrodes of the first touch unit and the second touch unit in the first interval. At the same time, it may also be beneficial to increase the coupling capacitance between the adjacent first touch electrodes 61 and the second touch electrodes 62.

Figure 15:
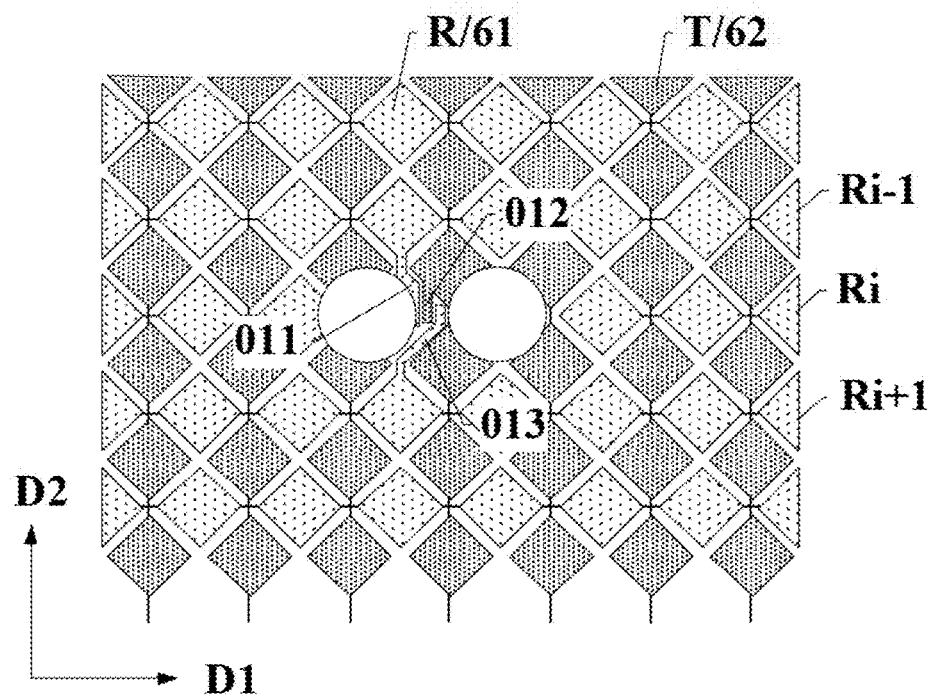
FIG. 15 is another schematic zoomed-in view of the area B in FIG. 2.

It should be noted that the embodiment in FIG. 14 is only described by taking the second touch unit Ti cut off by the mounting hole as an example. In some other embodiments of the present disclosure, when the first touch unit Ri is cut off by the mounting hole, three auxiliary electrodes may also be disposed in the first interval, as shown in FIG. 15, which is another enlarged schematic diagram of the area B in FIG. 2. FIG. 15 illustrates another approach in which three first auxiliary electrodes are disposed in the first interval. In this embodiment, the second sub-auxiliary electrode 012 may be electrically connected to the second touch electrode, the first sub-auxiliary electrode 011 may be electrically connected to Ri−1, and one of the third sub-auxiliary electrodes 013 may be electrically connected to Ri+1. In such a configuration, the second sub-auxiliary electrode 012 may be arranged adjacent to the first sub-auxiliary electrode 011 on the left side to form a coupling capacitance, and may be arranged adjacent to the third sub-auxiliary electrode 013 on the right side to form a coupling capacitance. Therefore, it may be beneficial to increase the area of the touch electrodes of the first touch unit and the second touch unit in the first interval, and at the same time, it may be beneficial to increase the coupling capacitance between the adjacent first touch electrodes 61 and the second touch electrodes 62, which may be beneficial to improve the touch sensitivity of the display panel.

Figure 16:
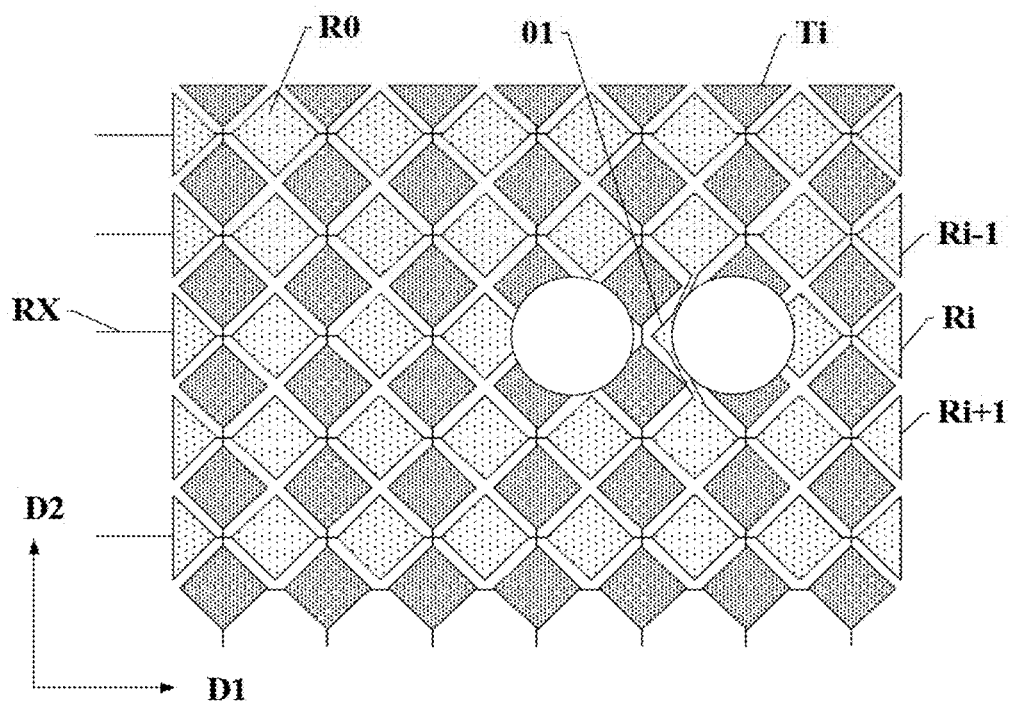
FIG. 16 is another schematic zoomed-in view of the area B in FIG. 2.
Figure 17:
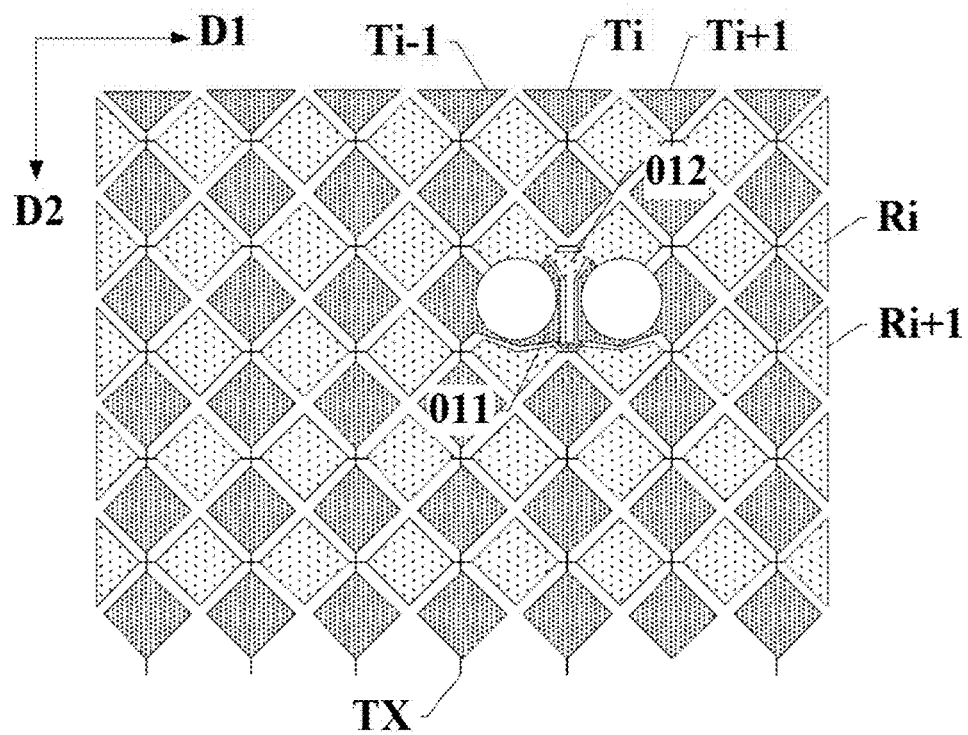
FIG. 17 is another schematic zoomed-in view of the area B in FIG. 2.

FIG. 16 and FIG. 17 respectively show another enlarged schematic view of the area B in FIG. 2. These embodiments show other solutions in which a first auxiliary electrode 01 is arranged between two adjacent mounting holes.

In one embodiment of the present disclosure, as shown FIG. 16, a same first auxiliary electrode 01 may be electrically connected to Ri+1 and Ri−1 at the same time, and the display panel may also include a touch signal line RX, and Ri+1 and Ri−1 electrically connected to the same first auxiliary electrode 01 may be electrically connected to the same touch signal line RX. Specifically, when the same first auxiliary electrode 01 in the first interval is connected to two first touch units at the same time, for example, Ri+1 and Ri−1, Ri+1 and Ri−1 may have a same potential, which may be equal to the same first touch unit. During a touch control, Ri+1, Ri−1 and the first auxiliary electrode 01 connected thereto may be regarded as a first touch unit with a larger area as a whole. At this time, one of Ri+1 and Ri−1 may be connected to the touch signal line to realize the transmission of the touch signal, and the other may not need to be connected to another touch signal line, thereby reducing the number of touch signal lines included in the display panel. Because the touch signal lines connected to the first touch unit need to be wound in the frame area of the display panel, when the number of touch signal lines connected to the first touch unit is reduced, it may also be beneficial to reduce the space occupied by touch signal lines in the frame area, and thus may be beneficial to realize the narrow frame design of the display panel.

In another embodiment, as shown in FIG. 17, the same first auxiliary electrode 011 may be electrically connected to Ti+1 and Ti−1 at the same time, the display panel may also include a touch signal line RX. Ti+1 and Ti−1 connected to the same first auxiliary electrode 01 may be connected to the same touch signal line RX. Specifically, when the same first auxiliary electrode 011 in the first interval is connected to two second touch units at the same time, for example, when being connected to Ti+1 and Ti−1 at the same time, Ti+1 and Ti−1 may be made to have a same potential, which may be equal to the same second touch unit. During the touch control, Ti+1, Ti−1 and the first auxiliary electrode 01 connected thereto may be regarded as a second touch unit with a larger area as a whole. At this time, the transmission of the touch signal may be realized by connecting one of the touch electrode units with the touch signal line, and the other one may not need to be connected with another touch signal line. The touch signal lines connected to the second touch unit may be connected to the driving chip. When the number of the touch signal lines is reduced, the number of signal terminals on the driving chip may also be reduced, which is beneficial to simplify the structure of the driving chip.

Figure 18:
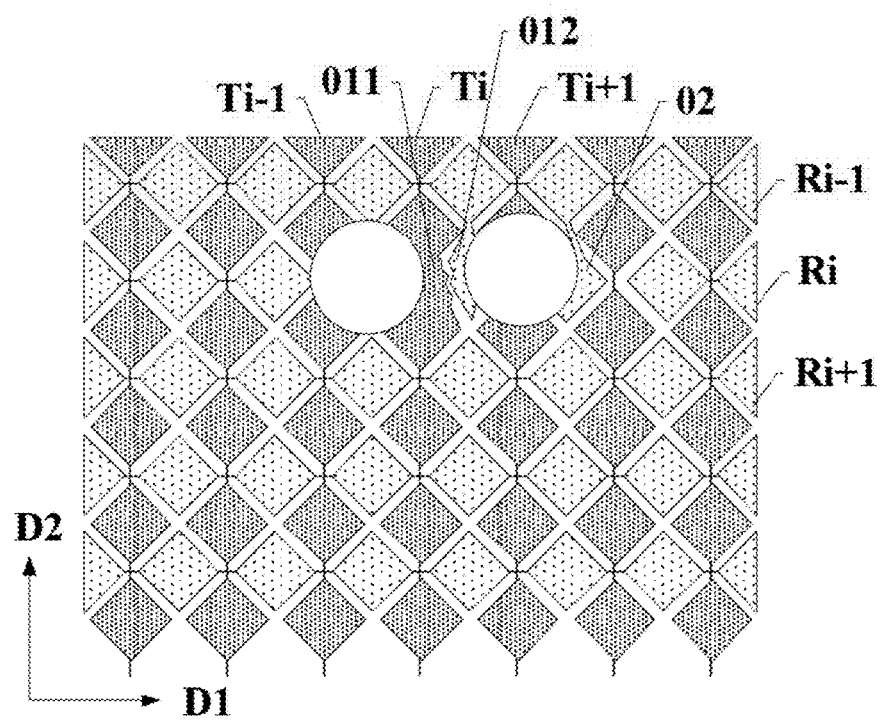
FIG. 18 is another schematic zoomed-in view of the area B in FIG. 2.
Figure 19:
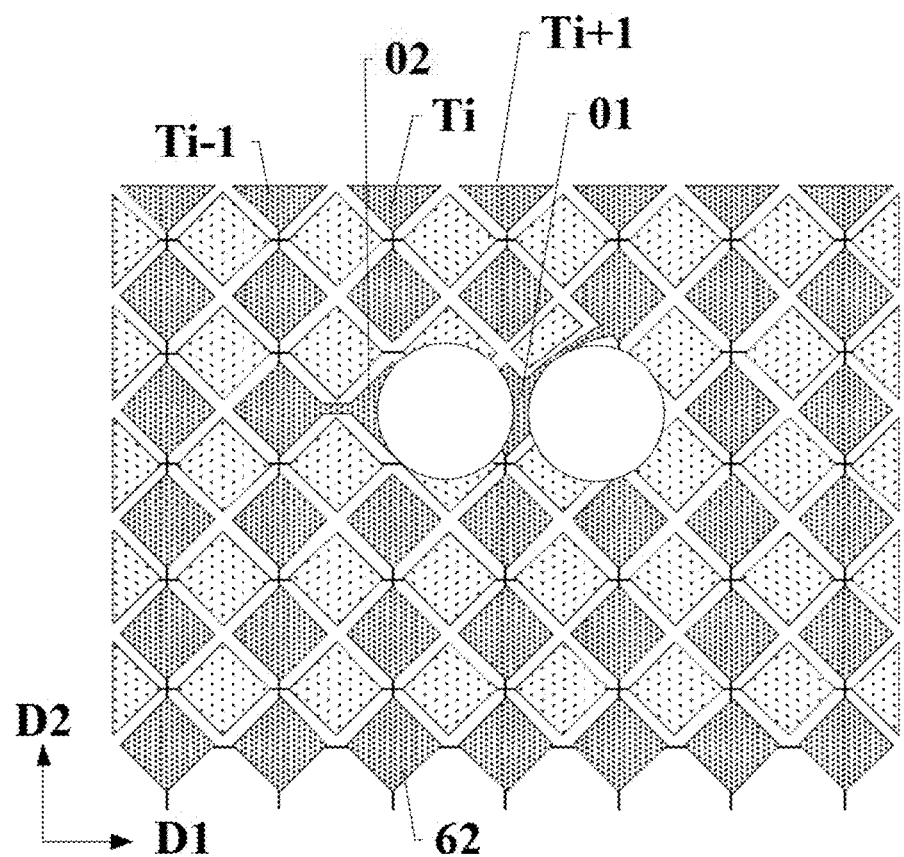
FIG. 19 is another schematic zoomed-in view of the area B in FIG. 2.

FIG. 18 and FIG. 19 respectively illustrate another enlarged schematic view of the area B in FIG. 2. In one embodiment of the present disclosure, the auxiliary electrode may further include a second auxiliary electrode 02. The second auxiliary electrode 02 may be located on the side of the mounting hole away from the first interval and adjacent to the mounting hole. The area of the orthographic projection of the second auxiliary electrode 02 on the plane where the substrate is located may be S3. The first touch electrode 61 may include the conventional first touch electrode R0, and the area of the orthographic projection of the conventional first touch electrode R0 on the substrate may be S1, and S3<75%×S1.

As shown in FIG. 18, the second auxiliary electrode 02 may be in a same row with the first touch electrode 61 in Ri, the second auxiliary electrode 02 may be insulated from Ri, and the second auxiliary electrode 02 may be electrically connected to at least one of Ri+1 and Ri−1.

In another embodiment, as shown in FIG. 19, the second auxiliary electrode 02 may be in a same column as Tj, the second auxiliary electrode 02 may be insulated from Tj, and the second auxiliary electrode 02 may be electrically connected to Tj+1 or Tj−1.

Specifically, referring to FIG. 18, when the touch electrode located on the side of the mounting hole away from the first interval in the first direction D1 is cut off by the mounting hole, if the touch electrode is in the same row as the first touch electrode 61, and the area of the touch electrode is less than 75%×S1, when the touch electrode still belongs to the first touch unit Ri, the first touch electrode 61 in the first touch unit may be missing more, resulting in reducing the touch performance. In this embodiment, the above-mentioned touch electrode cut off by the mounting hole may be used as the second auxiliary electrode 02, and the second auxiliary electrode 02 may be connected to at least one of Ri+1 and Ri−1. The solution of connecting the second auxiliary electrode 02 to Ri−1 may be equivalent to merging the second auxiliary electrode 02 and Ri−1, thereby increasing the total area of the first touch electrode 61 in Ri−1 and increasing the area of Ri−1. Accordingly, the direct facing area between Ri−1 and the second touch unit adjacent to Ri−1 may be increased. Thus, it may be conducive to increasing the coupling capacitance between Ri−1 and the second touch unit adjacent to Ri−1 when touching, and may be beneficial to improve touch signal in the touch area around the mounting hole. Therefore, it may be beneficial to improve the touch sensitivity of the area around the mounting hole.

Similarly, referring to FIG. 19, when the touch electrodes on the side of the mounting hole away from the first interval in the first direction D1 is cut off by the mounting hole, if the touch electrodes are in the same row as the second touch electrodes 62, and the area of the touch electrodes is less than 75%×S1, the second touch electrode 62 in Ti may be missing more, resulting in a lower touch performance around the mounting hole. In this embodiment, the second touch unit Ti may refer to a second touch unit in which the second touch unit Ti is not complete, and at least one second touch electrode in the column where the second touch unit Ti is located may be cut off by a mounting hole and may be missing a portion, resulting in the area of the second touch electrode being smaller than that of the conventional second touch electrode. In this embodiment, the above-mentioned touch electrode cut off by the mounting hole may be used as the second auxiliary electrode 02, and the second auxiliary electrode 02 may be connected to at least one of Ti−1 and Ti+1. The solution of connecting the second auxiliary electrode 02 to Ti−1 may be equivalent to merging the second auxiliary electrode 02 and Ti−1, thereby increasing the total area of the second touch electrode 62 in Ti−1 and increasing the directly facing area between Ti−1 and the first touch unit adjacent to Ti−1. Such a configuration may be conducive to increasing the coupling capacitance between Ti−1 and the first touch unit adjacent to Ti−1 when touching. Accordingly, it may be beneficial to increase the touch control signal in the the area around the mounting hole. Therefore, it may also be beneficial to improve the touch sensitivity of the area around the mounting hole.

Figure 20:
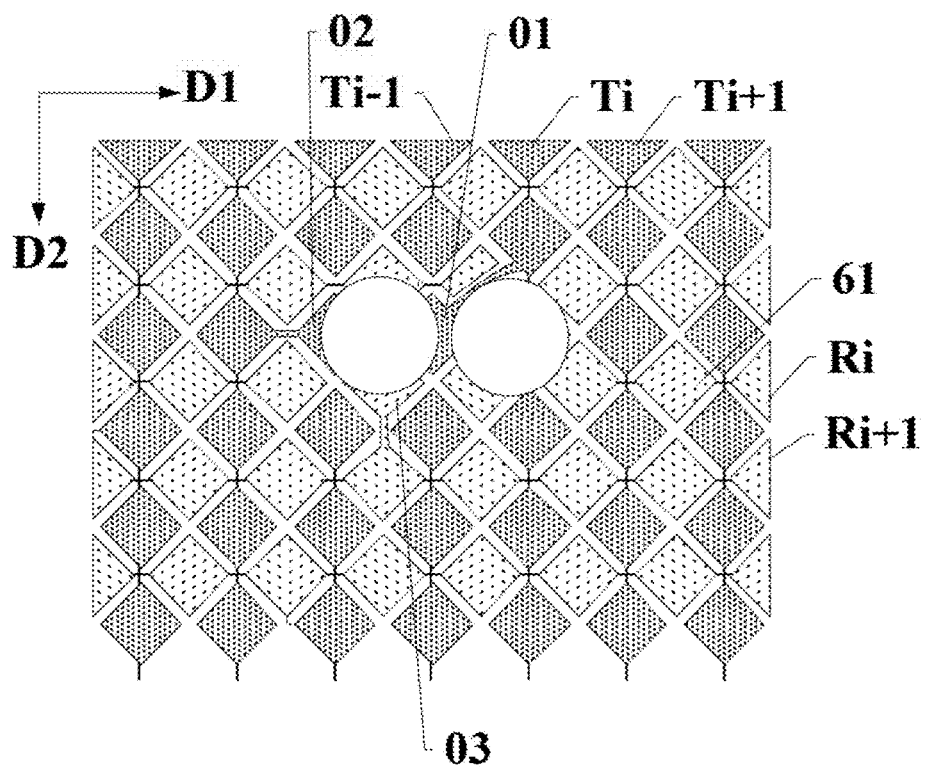
FIG. 20 is another schematic zoomed-in view of the area B in FIG. 2.
Figure 21:
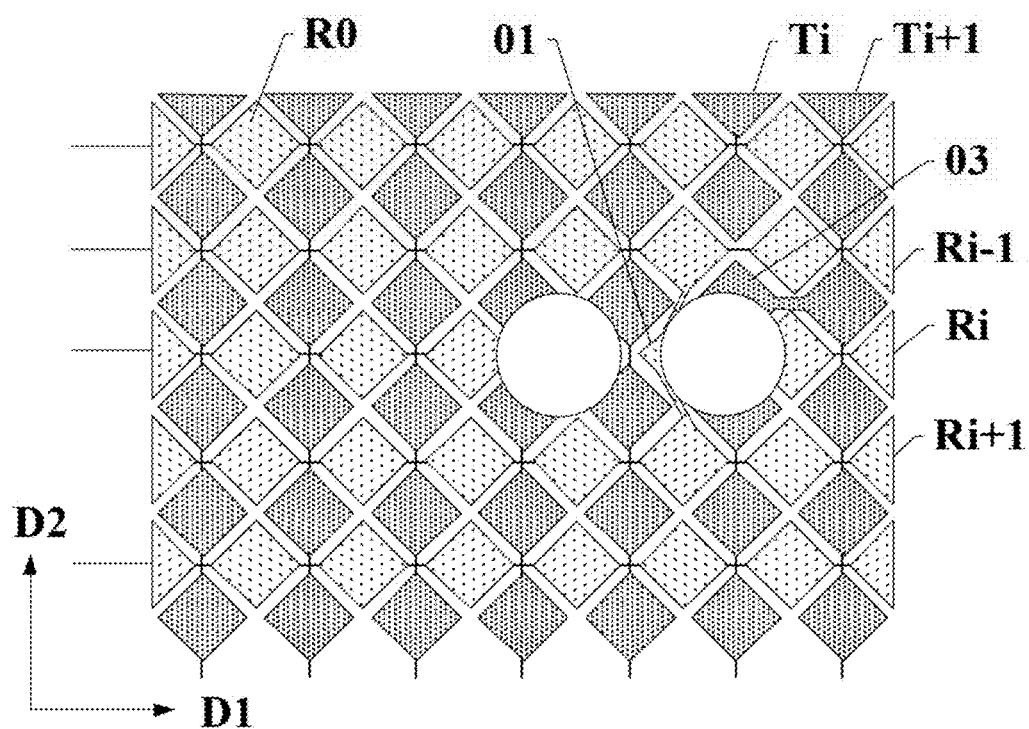
FIG. 21 is another schematic zoomed-in view of the area B in FIG. 2.

FIG. 20 and FIG. 21 respectively show another enlarged schematic view of area B in FIG. 2. As shown in FIGS. 20-21, in one embodiment of the present disclosure, the auxiliary electrode may further include a third auxiliary electrode 03. The third auxiliary electrode 03 may be located on at least one side of the mounting hole in the second direction D2, and may be adjacent to the mounting hole. The area of the orthographic projection of the third auxiliary electrode 03 on the plane where the substrate is located may be S4. The first touch electrode 61 may include the conventional first touch electrode R0, and the area of the orthographic projection of the conventional first touch electrode R0 on the substrate may be S1, and S4<75%×S1.

Referring to FIG. 20, the third auxiliary electrode 03 may be in a same row as the first touch electrode 61 in Ri, the third auxiliary electrode 03 may be insulated from Ri, and the third auxiliary electrode 03 may be electrically connected to at least one of Ri+1 and Ri−1.

In another embodiment, as shown in FIG. 21, the third auxiliary electrode 03 may be in the same column as Ti, the third auxiliary electrode 03 may be insulated from Ti, and the third auxiliary electrode 03 may be electrically connected to Ti+1 or Ti−1.

Referring to FIG. 20 and FIG. 21, the third auxiliary electrode 03 may be a touch electrode located above or below the mounting hole in the second direction D2 and cut off by the mounting hole, and the area of the third auxiliary electrode may be less than 75%×S1. In FIG. 20, the first touch electrode 61 of the first touch unit Ri in the row where the third auxiliary electrode 03 is located may be more missing. In FIG. 21, the second touch unit Ti in the row where the third auxiliary electrode 03 is located may be largely missing. If the third auxiliary electrode 03 is used as the first touch electrode 61 in the first touch unit in the row where it is located, or the third auxiliary electrode 03 may be used the second touch electrode 62 in the second touch unit in the column where it is located, the touch performance of the area around the mounting hole may be affected. Therefore, in the embodiment shown in FIG. 20, connecting the third auxiliary electrode 03 to Ri+1 may be beneficial to increase the total area of the first touch electrode 61 in Ri+1, and increase the facing area between Ri+1 and the second touch unit, which may be conducive to increasing the coupling capacitance between Ri+1 and its adjacent second touch unit during touch. Accordingly, it may be beneficial to improve the touch sensitivity of the surrounding area of the mounting hole. In some other embodiments of the present disclosure, the third auxiliary electrode 03 may also be connected to Ri−1, or be connected to Ri+1 and Ri−1 at the same time.

Similarly, in the embodiment shown in FIG. 21, when the third auxiliary electrode 03 is connected to Ti+1, the area of the second touch electrode 62 included in Ti+1 may be increased, and the facing area between Ti+1 and the adjacent first touch units may be increased at the same time. Thus, it may be conducive to increasing the coupling capacitance between the Ti+1 and the touch unit during touch; and it may be also conducive to improving the touch sensitivity of the area around the mounting hole.

Figure 22:
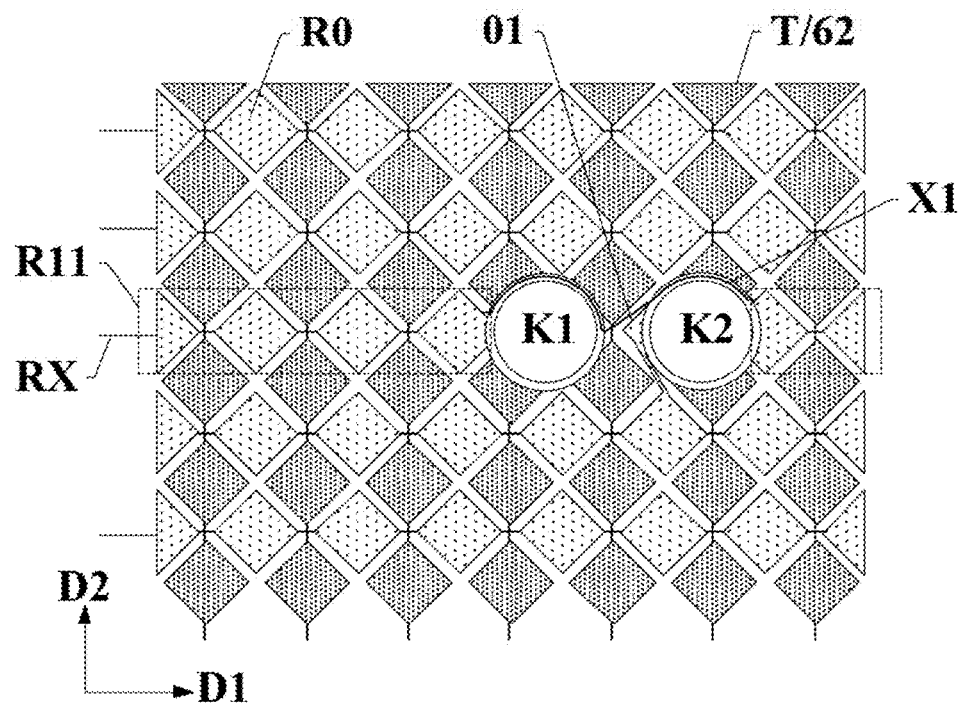
FIG. 22 is an exemplary connection between the first sub-touch unit and the second sub-touch unit and a touch wiring according to various disclosed embodiments.

FIG. 22 is a schematic diagram of a connection between the first sub-touch unit) R11 and the second sub-touch unit R12 and the touch wiring. As shown in FIG. 22, in one embodiment of the present disclosure, Ri may include the first sub-touch unit R11 and the second sub-touch unit R12 arranged in the first direction D1. The mounting holes may include a first mounting hole K1 and a second mounting hole K2 arranged adjacent to each other in the first direction D1. The first interval may be located between the first mounting hole K1 and the second mounting hole K2. The first sub-touch unit R11 may be located on the side of the first mounting hole K1 away from the first interval in the first direction D1, and the second sub-touch unit R12 may be located on the side of the second mounting hole K2 away from the first interval in the first direction D1.

The first sub-touch unit R11 and the second sub-touch unit R12 may be electrically connected through the first wiring X1. The first wiring X1 may be wound along the edges of the first mounting hole K1 and the second mounting hole K2, and at least a portion of the first wiring X1 may be located in the first interval.

Specifically, when the first touch unit is cut off by the mounting hole, the first sub-touch unit R11 located on the left side of the first mounting hole and the second sub-touch unit R12 located on the right side of the second mounting hole may be electrically connected through the first wiring X1, and the first wiring X1 may be wound along the edges of the first mounting hole K1 and the second mounting hole K2. Because there is a first interval between the first mounting hole K2 and the second mounting hole K2, the above-mentioned portion of the first routing X1 may also be located in the first interval. When the first sub-touch unit R11 and the second sub-touch unit R12 are connected through the first wiring X1, the first sub-touch unit R11 and the second sub-touch unit R12 may be equal-potential touch units. The two sub-touch unit may need to be connected with the touch signal line RX, thus it may be beneficial to reduce the number of touch signal lines connected to the first touch unit, and may be beneficial to realize the narrow frame design of the display panel.

It should be noted that since the first auxiliary electrode 01 is set in the first interval, the portion of the first trace X1 located in the first interval may be arranged in a different film layer from the first auxiliary electrode 01, which may facilitate the simplification of the layout of the first wiring X1.

Figure 23:
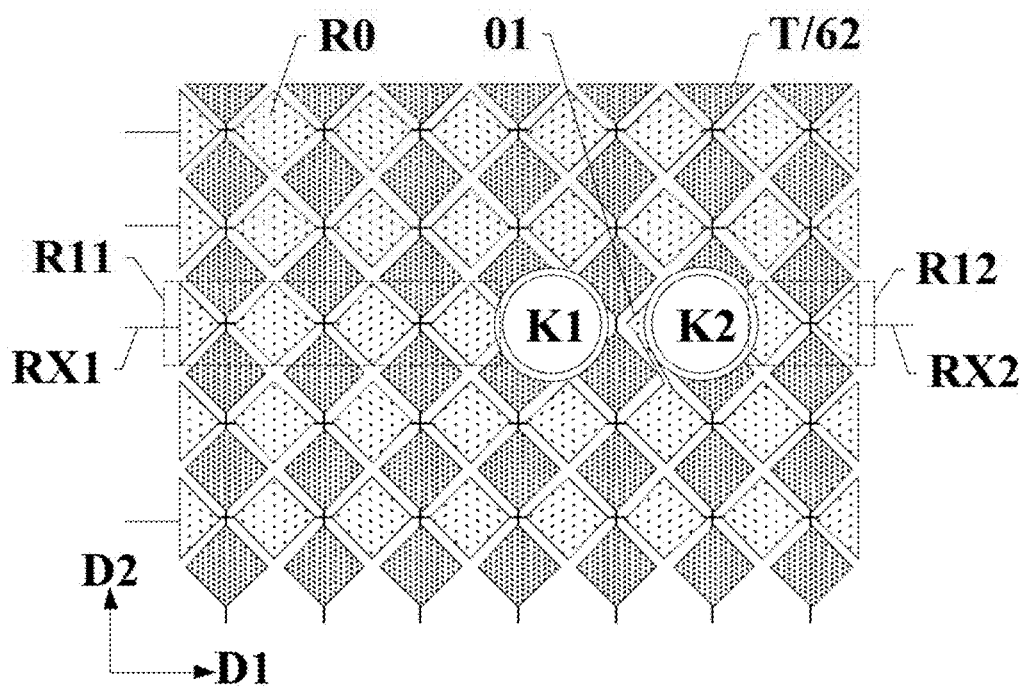
FIG. 23 is another exemplary connection between the first sub-touch unit and the second touch unit and a touch wiring according to various disclosed embodiments.

FIG. 23 is a schematic diagram of another connection between the first sub-touch unit R11 and the second sub-touch unit R12 and the touch wiring. As shown in FIG. 23, in one embodiment of the present disclosure, Ri may include the first sub-touch unit R11 and the second sub-touch unit R12 arranged in the first direction D1. The mounting holes may include the first mounting hole K1 and the second mounting hole K2 arranged adjacent to each other in the first direction D1, and the first interval may be located between the first mounting hole K1 and the second mounting hole K2. The first sub-touch unit R11 may be located on the side of the first mounting hole K1 away from the first interval in the first direction D1, and the second sub-touch unit R12 may be located on the side of the second mounting hole K2 away from the first interval in the first direction D1.

The first sub-touch unit R11 and the second sub-touch unit R12 may be respectively connected to different touch signal lines, and the first sub-touch unit R11 and the second sub-touch unit R12 may be insulated from each other.

Specifically, when the first touch unit is cut off by the mounting hole, the first sub-touch unit R11 on the left side of the first mounting hole K1 and the second sub-touch unit R12 on the right side of the second mounting hole K2 may be considered as two independent touch units. The first sub-touch unit R11 and the second sub-touch unit R12 may be respectively connected to different touch signal lines. The touch signal line RX1 connected to the first sub-touch unit R11 may be distributed on the left frame of the display panel, and the touch signal line RX2 connected to the second sub-touch unit R12 may be routed in the right frame of the display panel. In such a configuration, the first sub-touch unit R11 and the second sub-touch unit R12 may form an electrical connection by wiring around the mounting holes and the first interval, which may be beneficial to simplify the overall wiring difficulty of the display panel.

Figure 24:
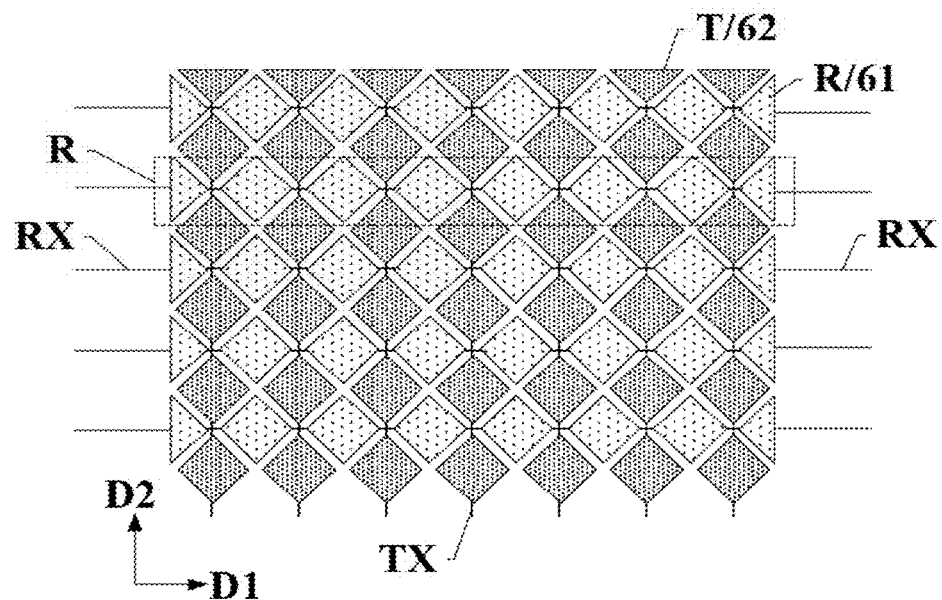
FIG. 24 is an exemplary connection between the first touch unit and the first touch wiring according to various disclosed embodiments.

In one embodiment of the present disclosure, the display panel may further include a first touch signal line RX. Referring to FIG. 4, the same first touch unit R may be electrically connected to the same first touch signal line RX, or, referring to FIG. 24, two ends of the same first touch unit R in the first direction D1 may be respectively connected to different first touch signal lines RX. FIG. 24 is a schematic diagram showing a connection between the first touch unit and the first touch signal line.

Specifically, the embodiment shown in FIG. 4 shows a scheme in which a first touch unit R is connected to a first touch signal line RX, and each first touch unit may transmit signals through the first touch signal line connected to the first touch unit, which may be equivalent to a one-to-one relationship between the first touch unit and the first touch signal line connected to the first touch unit. Accordingly, it may be beneficial to reduce the number of first touch units connected to the first touch unit in the display panel and reduce the frame space occupied by the first touch signal lines in the frame area of the display panel. Thus, it may be beneficial to realize the narrow frame design of the display panel.

It should be noted that FIG. 4 only shows the solution that the touch signal lines RX connected to the first touch unit R are distributed on both sides of the first touch unit R. In some other embodiments of the present disclosure, the first touch signal lines RX may also be distributed on the same side of the first touch unit R.

The embodiment shown in FIG. 24 shows a scheme in which the same first touch unit R is correspondingly connected to two first touch signal lines RX. In such a configuration, two opposite ends of one touch signal line in the first direction D may be electrically connected to two different first touch signal lines respectively. Thus, the touch signals corresponding to the first touch unit may be transmitted on two first touch signal lines at the same time, which may be beneficial to improve the transmission stability and reliability of the touch signal. Accordingly, it may be beneficial to ensure the timeliness of the touch signal transmission, and thus facilitate improving the touch sensitivity.

Figure 25:
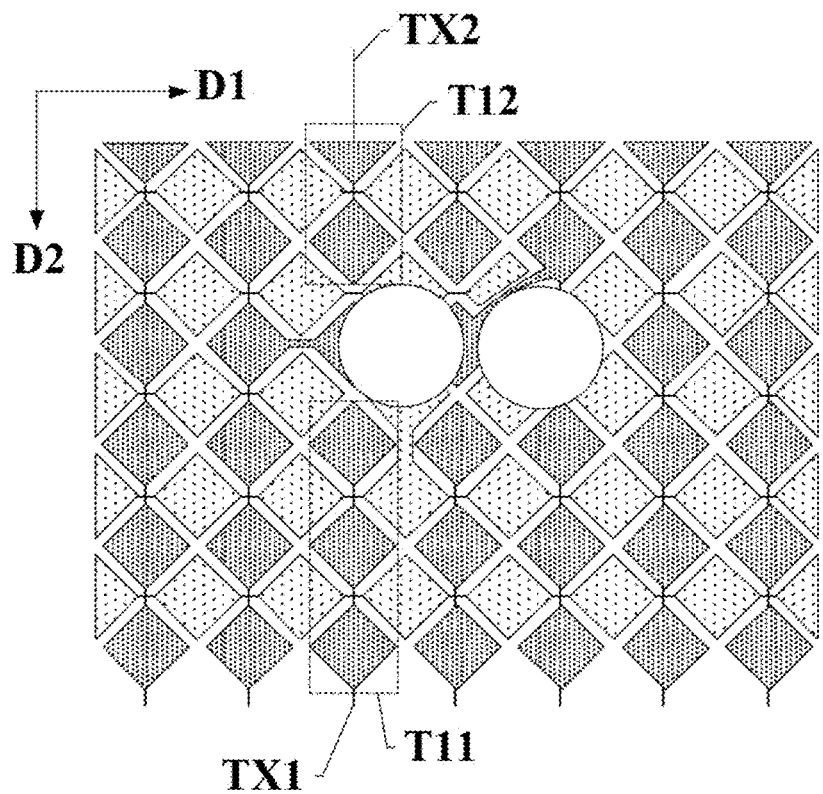
FIG. 25 is an exemplary connection between the fourth touch unit and the third touch unit and the second touch wiring according to various disclosed embodiments.

FIG. 25 is a schematic diagram of a connection between the third touch unit and the fourth touch unit and the second touch signal line. As shown in FIG. 25, in embodiment of the present disclosure, the display panel may further include a second touch signal line. Ti may include a third sub-touch unit T11 and a fourth sub-touch unit T12. In the second direction D2, the third sub-touch unit T11 may be located on the first side of the mounting hole, the fourth sub-touch unit T12 may be located on the second side of the mounting hole, and the first side and the second side may be opposite in the second direction D2. The third sub-touch unit T11 and the fourth sub-touch unit T12 may be respectively connected to different second touch signal lines, and the third sub-touch unit T11 and the fourth sub-touch unit T12 may be insulated from each other.

Referring to FIG. 25, this embodiment shows a connection mode between the third sub-touch unit T11 and the fourth sub-touch unit T12 and the second touch signal line when the second touch unit is cut off by the mounting hole. The third sub-touch unit T11 located on the first side of the mounting hole in the second direction D2 may be connected to a second touch signal line TX1, and the fourth sub-touch unit T12 located on the second side of the mounting hole in the second direction D2 may be electrically connected to another second touch signal line TX2. Accordingly, the third sub-touch unit T11 and the fourth sub-touch unit T12 may be independent of each other, and there may be no need to connect the third sub-unit T11 and the fourth sub-touch unit T12 by wiring around the mounting holes, which may be conducive to simplifying the wiring difficulty of the display panel.

Figure 26:
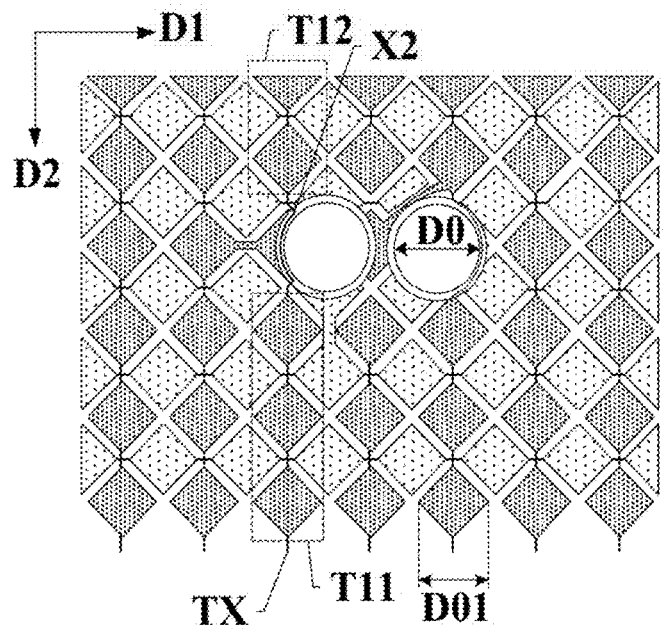
FIG. 26 is another exemplary connection between the fourth touch unit and the third touch unit and the second touch wiring according to various disclosed embodiments.

FIG. 26 is a schematic diagram of another connection between the third touch unit and the fourth touch unit and the second touch signal line.

As shown in FIG. 26, in one embodiment of the present disclosure, the display panel may further include a second touch signal line. Ti may include a third sub-touch unit T11 and a fourth sub-touch unit T12. In the second direction D2, the third sub-touch unit T11 may be located on the first side of the mounting hole, the fourth sub-touch unit T12 may be located on the second side of the mounting hole, and the first side and the second side may be opposite in the second direction D2. The third sub-touch unit T11 and the fourth sub-touch unit T12 may be electrically connected through the second wiring X2, and at least a portion of the second wiring X2 may be wound along the edges of the mounting holes.

This embodiment shows another approach of connecting the third sub-touch unit T11 and the fourth sub-touch unit T12 to the second touch signal line when the second touch unit is cut off by the mounting hole. Specifically, the third sub-touch unit T11 and the fourth sub-touch unit T12 may be electrically connected through the second wiring X2. Because the third sub-touch unit T11 and the fourth sub-touch unit T12 may be isolated by the mounting holes, the second wiring X2 may be wound along the edges of the mounting holes. When the third sub-touch unit T11 and the fourth sub-touch unit T12 are connected through the second wiring X2, only one of the third sub-touch unit T11 and the fourth sub-touch unit T12 may need to be connected to the control signal line TX. For example, only the fourth sub-touch unit T12 may need to be connected to the second touch signal line. Because the fourth sub-touch unit T12 may be closer to the driving chip, when the fourth sub-touch unit T12 is connected to the second touch signal line, it may be beneficial to reduce the length of the second touch signal line and also to simplify the wiring complexity.

In one embodiment of the present disclosure, referring to FIG. 26, the diameter of at least one mounting hole may be D0, the maximum width of a single conventional first touch electrode R0 in the first direction D1 or the second direction D2 may be D01, and D01≤D0≤1.5×D01.

The mounting holes of the display panel may be used to install optical devices such as cameras. If the diameter of the mounting hole is set smaller, for example, it is smaller than the maximum width D01 of a single conventional first touch electrode R0 in the first direction D1 or the second direction D2, it may cause the diameter of the mounting hole to be too small, making it difficult to install the optical device. However, if the diameter of the mounting hole is too large, for example greater than 1.5×D01, the mounting hole may occupy a large space in the display panel, which may affect the screen-to-body ratio of the display panel. Therefore, setting D01≤D≤1.5×D01 in the embodiment of the present disclosure may not only ensure enough space for installing the optical device, reduce the difficulty of installing the optical device, but also prevent the mounting hole from occupying too much space in the display panel, thereby effectively ensuring the screen-to-body ratio of the display panel. In some embodiments, D0=1.2×D01, or D0=1.4×D01.

It should be noted that the above-mentioned embodiment only takes two mounting holes as circular as an example for illustration. In some other embodiments of the present disclosure, only one of the two adjacent mounting holes may be circular in shape, and the shape of the other mounting hole may be set according to actual needs.

Figure 27:
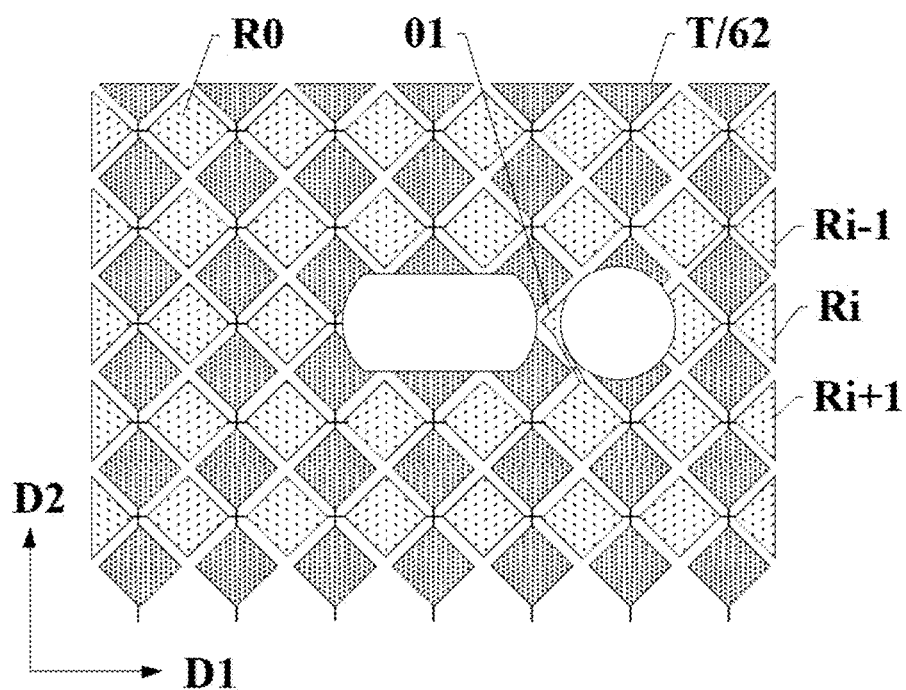
FIG. 27 is another schematic zoomed-in view of the area B in FIG. 2.

FIG. 27 is another enlarged schematic diagram of the area B in FIG. 2. As shown in FIG. 27, in some embodiments, one of the two adjacent mounting holes may be the mounting holes with a circular shape and the other mounting hole may be elongated to a stripe shape.

Figure 28:
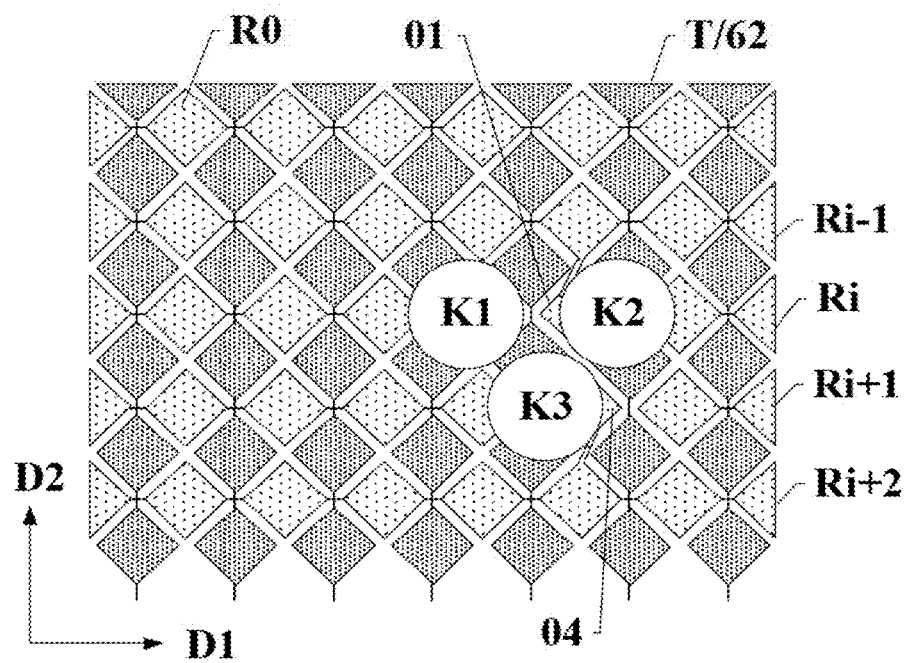
FIG. 28 is another schematic zoomed-in view of the area B in FIG. 2.

It should also be noted that the above-mentioned embodiment only includes two mounting holes in the area B as an example, but does not limit the number of actually included mounting holes. When the area B includes more than two mounting holes, it may also be applied to the present disclosure. For example, referring to FIG. 28, which is another enlarged schematic view of the area B in FIG. 2, if the touch electrode area between the first mounting hole K1 and the third mounting hole K3, or between the second mounting hole K2 and the third mounting hole K3, or around the third mounting hole K3 is relatively small, for example, less than 75% of the conventional first touch electrode R0, a portion of the touch electrodes may also be used as auxiliary electrodes to connect with other touch electrodes. For example, this embodiment shows that when some of the first touch electrodes in Ri+1 is cut off by the third mounting hole K3, the touch electrode located on the right side of the third mounting hole may be used as the fourth auxiliary electrode 04, and the fourth auxiliary electrode 04 may be connected to Ri+2, which may also be beneficial to improve the touch sensitivity around the third mounting hole K3. It should be noted that the fourth auxiliary electrode 04 may be insulated from the second touch electrode.

Figure 29:
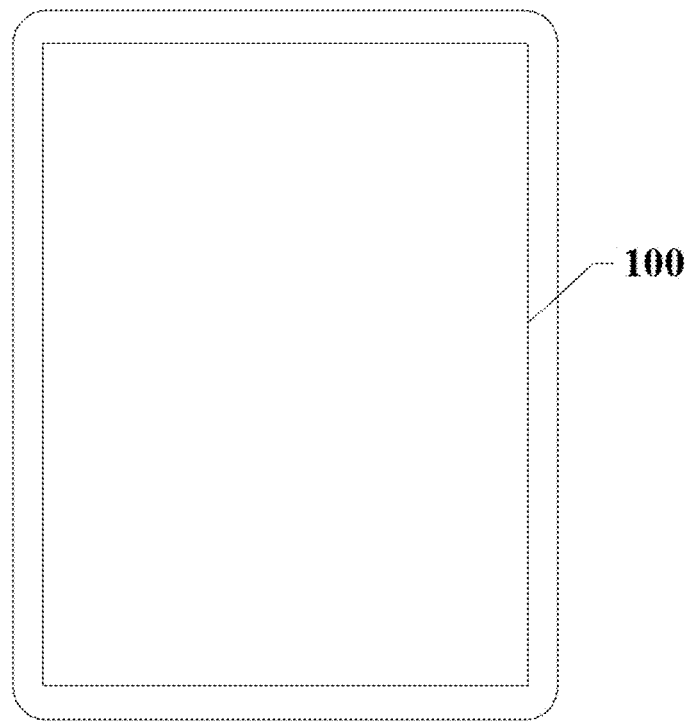
FIG. 29 is a schematic structural diagram of an exemplary display device according to various disclosed embodiments of the present disclosure.

The present disclosure also provides a display device. FIG. 29 is a schematic structural view of an exemplary display device according to various disclosed embodiments of the present disclosure. As shown in FIG. 29, the display device may include the display panel 100 provided by any one of the above embodiments or other appropriate display panel.

It can be understood that the display device 200 provided in the embodiment of the present disclosure may be a mobile phone, a tablet, a computer, a TV, a vehicle display device and other display devices with display functions and touch capabilities, and the present disclosure does not specifically limit this. The display device provided by the embodiments of the present disclosure may include the beneficial effect of the display panel provided by the embodiment of the present disclosure. For details, reference may be made to the specific descriptions of the display panel in the above embodiments, and details will not be repeated here in this embodiment.

It can be known from the above embodiments that the display panel and the display device provided by the present disclosure may at least achieve the following beneficial effects:

The touch layer in the display panel provided by the present disclosure may include a plurality of first touch units and a plurality of second touch units. The first touch units and the second touch units may include mutual capacitance structures. The first touch electrodes in the first touch unit may be arranged in a first direction and connected in series, and the second touch electrodes in the second touch unit may be arranged in a second direction and connected in series. The touch area may be provided with at least two mounting holes, and there is a first interval between two adjacent mounting holes arranged in the first direction, and the touch layer may further include a first auxiliary electrode located in the first interval. When the first touch unit Ri is cut off by the mounting hole, the first auxiliary electrode located in the first interval may be connected to at least one of Ri+1 and Ri−1, which may be equivalent to combining the first auxiliary electrode to at least one of Ri+1 and Ri−1, and the area of Ri+1 or Ri−1 may be increased. Thus, it may be beneficial to increase the relative area of the second touch unit and Ri or Ri+1. Accordingly, which may be conducive to increasing the touch sensitivity of the area where the second touch unit is facing Ri or Ri+1, and may be conducive to improving the touch sensitivity of the area between two adjacent mounting holes. When the second touch unit Ti is cut off by the mounting hole, the first auxiliary electrode located in the first interval may be connected to at least one of Ti+1 and Ti−1, which may be equivalent to merging the first auxiliary electrode to at least one of Ti+1 and Ti−1; and the area of Ti+1 or Ti−1 may be increased. Thus, it may be beneficial to increase the relative area between the first touch unit and Ti+1 or Ti−1, thereby helping to increase the area between the first touch unit and Ti−1. Accordingly, the touch sensitivity of the area facing Ti or Ti+1 may be increased and it may be beneficial to improve the touch sensitivity of the area between two adjacent mounting holes.

Although some specific embodiments of the present disclosure have been described in detail through examples, those skilled in the art should understand that the above examples are for illustration only and not intended to limit the scope of the present disclosure. Those skilled in the art will appreciate that modifications may be made to the above embodiments without departing from the scope and spirit of the disclosure. The scope of the present disclosure may be defined by the appended claims.

What is claimed is:

1. A display panel, comprising:
a substrate; and
a touch layer disposed on one side of the substrate and including a touch area of the display panel,
wherein:
the touch layer includes a plurality of first touch units and a plurality of second touch units;
the plurality of first touch units extend in a first direction and are arranged in a second direction;
the plurality of second touch units extend in the second direction and are arranged in the first direction;
the plurality of first touch units include a plurality of first touch electrodes arranged in the first direction and connected with each other in series;
the plurality of the second touch units include a plurality of second touch electrodes arranged in the second direction and connected with each other in series;
the plurality of first touch electrodes are insulated from the plurality of second touch electrodes;
the display panel includes two mounting holes located in the touch area;
the touch layer is hollowed out at positions of the two mounting holes;
the two mounting holes are arranged in the first direction;
a first interval is provided between the two mounting holes;
the touch layer further includes an auxiliary electrode;
the auxiliary electrode includes a first auxiliary electrode located in the first interval;
at least one of the plurality of first touch units is cut off by the two mounting holes;
the first touch unit cut off by the two mounting holes is a first touch unit i arranged in the second direction;
first touch units adjacent to the first touch unit i in the second direction are a first touch unit (i+1) and a first touch unit (i−1), respectively;
the first auxiliary electrode is connected to at least one of the first touch unit (i+1) and the first touch unit (i−1);
or
at least one of the plurality of second touch units is cut off by the two mounting holes;
the second touch unit cut off by the two mounting holes is a second touch unit i arranged in the first direction;
second touch units adjacent to the second touch unit i in the first direction are a second touch unit (i+1) and a second touch unit (i−1), respectively;
the first auxiliary electrode is connected to at least one of the second touch unit (i+1) and the second touch unit (i−1); and
i≥2, and i is an integer;
an area of an orthographic projection of the first auxiliary electrode on the substrate is S0;
the first touch electrode includes a conventional first touch electrode;
an area of an orthographic projection of the conventional first touch electrode on the substrate is S1;
S0<S1; and
the conventional first touch electrode is not adjacent to both of the two mounting holes and an edge of the touch area.

2. The display panel according to claim 1, wherein: S0≤75%×S1.

3. The display panel according to claim 1, wherein: at least two first auxiliary electrodes are included in the first interval;
one of the at least two first auxiliary electrodes is connected to at least one of the first touch unit (i+1) and the first touch unit (i−1); and
another of the at least two first auxiliary electrodes are electrically connected to the the second touch unit i arranged in the first direction.

4. The display panel according to claim 3, wherein:
in the first interval, the at least two first auxiliary electrodes are respectively a first sub-auxiliary electrode and a second sub-auxiliary electrode;
the first sub-auxiliary electrode and the second sub-auxiliary electrode are arranged opposite to each other;
the first sub-auxiliary electrode includes a first surface disposed adjacent to the second sub-auxiliary electrode;
the second sub-auxiliary electrode includes a second surface disposed adjacent to the first sub-auxiliary electrode;
the first surface and the second surfaces both include zigzag structures; and
the zigzag structures of the first surface engage with the zigzag structures of the second surface.

5. The display panel according to claim 1, wherein:
three first auxiliary electrodes are included in the first interval;
the three first auxiliary electrodes are respectively a first sub-auxiliary electrode, a second sub-auxiliary electrode and a third sub-auxiliary electrode;
in the first direction, the first sub-auxiliary electrode and the third sub-auxiliary electrode are respectively located on a same side of the second sub-auxiliary electrode;
the second sub-auxiliary electrode is electrically connected to a second touch electrode of the plurality of second touch electrodes;
the first sub-auxiliary electrode is electrically connected to one of the first touch unit i and the first touch unit (i+1) and the third sub-auxiliary electrode is electrically connected to another of the first touch unit i and the first touch unit (i+1); or
the first sub-auxiliary electrode is electrically connected to one of the first touch unit (i−1) and the first touch unit (i+1), and the third sub-auxiliary electrode is electrically connected to another of the first touch unit (i−1) and the first touch unit (i+1).

6. The display panel according to claim 1, wherein:
three first auxiliary electrodes are included in the first interval;
the three first auxiliary electrodes are respectively a first sub-auxiliary electrode, a second sub-auxiliary electrode and a third sub-auxiliary electrode;
in the first direction, the first sub-auxiliary electrode and the third sub-auxiliary electrode are located on two sides of the second sub-auxiliary electrode, respectively;
the second sub-auxiliary electrode is electrically connected to at least one of the first touch unit i and the first touch unit (i+1) and the first sub-auxiliary electrode is electrically connected to the the second touch unit i arranged in the first direction; or
the second sub-auxiliary electrode is electrically connected to a second touch electrode of the plurality of second touch electrodes;
one of the first sub-auxiliary electrode and the third auxiliary electrode is electrically connected to the first touch unit (i−1) and another of the first sub-auxiliary electrode and the third auxiliary electrode is electrically connected to the first touch unit (i+1);

at least a portion of the first sub-auxiliary electrode is located at a first side of the second sub-auxiliary electrode;

at least a portion of the third sub-auxiliary electrode is located at a second side of the second sub-auxiliary electrode; and the first side is opposite to the second side in the first direction.

7. The display panel according to claim 1, wherein:

the first auxiliary electrode is electrically connected to the first touch unit (i+1) and the first touch unit (i−1) at the same time; or the first auxiliary electrode is electrically connected to the second touch unit (i+1) and the second touch unit (i−1) at the same time.

8. The display panel according to claim 7, further comprising:

a touch signal line, wherein:

the first touch unit (i+1) and the first touch unit (i−1) connected to the first auxiliary electrode are connected to the touch signal line; or the second touch unit (i+1) and the second touch unit (i−1) connected to the first auxiliary electrode are connected the touch signal line.

9. The display panel according to claim 1, wherein the auxiliary electrode further comprises:

a second auxiliary electrode, disposed at a side of the two mounting holes away from the first interval and adjacent to the two mounting holes, wherein:

an area of an orthographic projection of the second auxiliary electrode on a plane where the substrate is located is S3;

S3<75%×S1;

the second auxiliary electrode is in a same row with the first touch electrode in the first touch unit i, the second auxiliary electrode is insulated from the first touch unit i, the second auxiliary electrode is electrically connected with at least one of the first touch unit (i+1) and the first touch unit (i−1); or the second auxiliary electrode is in a same column as the second touch unit i, the second auxiliary electrode is insulated from the second touch unit i, and the second auxiliary electrode is electrically connected to one of the second touch unit (i+1) and the second touch unit (i−1).

10. The display panel according to claim 1, wherein the auxiliary electrode further comprises:

a third auxiliary electrode, located on at least one side of the at least two mounting holes in the second direction and adjacent to the at least two mounting holes, wherein:

an area of an orthographic projection of the third auxiliary electrode on a plane where the substrate is located is S4;

S4<75%×S1;

the third auxiliary electrode is in a same row as the first touch electrode in the first touch unit i, the third auxiliary electrode is insulated from the first touch unit i, and the third auxiliary electrode is electrically connected to at least one of the first touch unit (i+1) and the first touch unit (i−1); or the third auxiliary electrode is in a same column as the second touch unit i, the third auxiliary electrode is insulated from the second touch unit i, and the third auxiliary electrode is electrically connected to the second touch unit (i+1) or the second touch unit (i−1).

11. The display panel according to claim 1, wherein:

the first touch unit i includes a first sub-touch unit and a second sub-touch unit arranged in the first direction;

the two mounting holes include a first mounting hole and a second mounting hole adjacently arranged in the first direction;

the first interval is located between the first mounting hole and the second mounting hole;

the first sub-touch unit is located on a side of the first mounting hole away from the first interval in the first direction;

the second sub-touch unit is located on a side of the second mounting hole away from the first interval in the first direction;

the first sub-touch unit and the second sub-touch unit are electrically connected through a first wiring; and the first wiring is wound along edges of the first mounting hole and the second mounting hole and at least a portion of the first wiring is located in the first interval.

12. The display panel according to claim 10, wherein:

the first touch unit i includes a first sub-touch unit and a second sub-touch unit arranged in the first direction;

the two mounting holes include a first mounting hole and a second mounting hole adjacently arranged in the first direction;

the first interval is located between the first mounting hole and the second mounting hole;

the first sub-touch unit is located on a side of the first mounting hole away from the first interval in the first direction;

the second sub-touch unit is located on a side of the second mounting hole away from the first interval in the first direction;

the first sub-touch unit and the second sub-touch unit are electrically connected to different touch signal wirings; and the first sub-touch unit and the second sub-touch unit are insulated from each other.

13. The display panel according to claim 1, further comprising:

a first touch signal line, wherein a same first touch unit is electrically connected to a same first touch signal line, or two ends of the same first touch unit in the first direction are respectively connected to different first touch signal lines.

14. The display panel according to claim 1, further comprising:

a second touch signal line, wherein:

the second touch unit i includes a third sub-touch unit and a fourth sub-touch unit;

in the second direction, the third sub-touch unit is located at a first side of the two mounting holes, and the fourth sub-touch unit is located on a second side of the two mounting holes, and the first side and the second side are opposite along the second direction; and the third sub-touch unit and the fourth sub-touch unit are respectively connected to different second touch signal lines, and the third sub-touch unit is insulated from the fourth sub-touch unit.

15. The display panel according to claim 1, further comprising:

a second touch signal line,
wherein:
the second touch unit i includes a third sub-touch unit and a fourth sub-touch unit;
in the second direction, the third sub-touch unit is located at a first side of the at least two mounting holes, and the fourth sub-touch unit is located on a second side of the at least two mounting holes, and the first side and the second side are opposite in the second direction; and
the third sub-touch unit and the fourth sub-touch unit are electrically connected through a second wring, and a portion of the second wiring is wound around edges of the at least two mounting holes.

16. The display panel according to claim 1, wherein:
a diameter of at least one of the two mounting holes is $D0$;
a maximum width of a single conventional first touch electrode in the first direction or the second direction is $D01$; and
$D01 \leq D0 \leq 1.5 \times D01$.

17. The display panel according to claim 1, further comprising:
a driving layer and a display layer located between the substrate and the touch layer,
the display layer is located on a side of the driving layer away from the substrate;
the display layer includes an anode, a light-emitting material layer and a cathode; and
the anode is electrically connected to the driving layer.

18. A display device, comprising:
a display panel, including:
a substrate; and
a touch layer disposed on one side of the substrate and including a touch area of the display panel,
wherein:
the touch layer includes a plurality of first touch units and a plurality of second touch units;
the plurality of first touch units extend in a first direction and are arranged in a second direction;
the plurality of second touch units extend in the second direction and are arranged in the first direction;
the plurality of first touch units include a plurality of first touch electrodes arranged in the first direction and connected with each other in series;
the plurality of the second touch units include a plurality of second touch electrodes arranged in the second direction and connected with each other in series;
the plurality of first touch electrodes are insulated from the plurality of second touch electrodes;
the display panel includes two mounting holes located in the touch area;
the touch layer is hollowed out at positions of the two mounting holes;
the two mounting holes are arranged in the first direction;
a first interval is provided between the two mounting holes;
the touch layer further includes an auxiliary electrode;
the auxiliary electrode includes a first auxiliary electrode located in the first interval;
at least one of the plurality of first touch units is cut off by at least one of the two mounting holes;
the first touch unit cut off by the two mounting holes is a first touch unit i arranged in the second direction;
first touch units adjacent to the first touch unit i in the second direction are a first touch unit (i+1) and a first touch unit (i−1), respectively;
the first auxiliary electrode is connected to at least one of the first touch unit (i+1) and the first touch unit (i−1);
or
at least one of the plurality of second touch units is cut off by the two mounting holes;
the second touch unit cut off by the two mounting holes is a second touch unit i arranged in the first direction;
second touch units adjacent to the second touch unit i in the first direction are a second touch unit (i+1) and a second touch unit (i−1), respectively;
the first auxiliary electrode is connected to at least one of the second touch unit (i+1) and the second touch unit (i−1); and
i≥2, and i is an integer;
an area of an orthographic projection of the first auxiliary electrode on the substrate is $S0$;
the first touch electrode includes a conventional first touch electrode;
an area of an orthographic projection of the conventional first touch electrode on the substrate is $S1$;
$S0<S1$; and
the conventional first touch electrode is not adjacent to both of the two mounting holes and an edge of the touch area.

* * * * *